(12) United States Patent
Steffens et al.

(10) Patent No.: US 12,255,084 B2
(45) Date of Patent: Mar. 18, 2025

(54) HANDLE FOR WAFER CARRIER

(71) Applicant: ENTEGRIS, INC., Billerica, MA (US)

(72) Inventors: Jason T. Steffens, Shakopee, MN (US); Mark V. Smith, Colorado Springs, CO (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 471 days.

(21) Appl. No.: 17/613,418

(22) PCT Filed: May 20, 2020

(86) PCT No.: PCT/US2020/033784
§ 371 (c)(1),
(2) Date: Nov. 22, 2021

(87) PCT Pub. No.: WO2020/236923
PCT Pub. Date: Nov. 26, 2020

(65) Prior Publication Data
US 2022/0230900 A1 Jul. 21, 2022

Related U.S. Application Data

(60) Provisional application No. 62/851,983, filed on May 23, 2019.

(51) Int. Cl.
*H01L 21/673* (2006.01)

(52) U.S. Cl.
CPC .. *H01L 21/67373* (2013.01); *H01L 21/67379* (2013.01); *H01L 21/67386* (2013.01)

(58) Field of Classification Search
CPC ............. H01L 21/67379; B65D 2525/285
See application file for complete search history.

(56) References Cited

U.S. PATENT DOCUMENTS

| 3,447,194 A * | 6/1969 | Bush | B65D 25/2826 |
| | | | 16/405 |
| 4,663,802 A * | 5/1987 | Kunzler | A45C 13/26 |
| | | | 16/259 |
| 5,652,999 A * | 8/1997 | Jarvis | E04F 21/06 |
| | | | 16/110.1 |
| 5,788,082 A | 8/1998 | Nyseth | |
| 5,813,504 A * | 9/1998 | Iny | B62B 5/06 |
| | | | 16/408 |

(Continued)

FOREIGN PATENT DOCUMENTS

| CN | 1173039 A | 2/1998 |
| JP | 3074609 U | 1/2001 |

(Continued)

*Primary Examiner* — Ernesto A Grano
*Assistant Examiner* — Symren K Sanghera

(57) ABSTRACT

A handle for a wafer carrier that includes an insertable member configured to be inserted into an aperture of the wafer carrier, and a locking mechanism moveable relative to the insertable member. A tab of the insertable member retains the insertable member in the aperture when in an engaged state. When in a locked state, the locking mechanism maintains the tab in the engaged state and a flexible member of the locking mechanism is positioned to maintain the locking mechanism in the locked state. A wafer carrier includes the detachable handle and the locking mechanism.

16 Claims, 31 Drawing Sheets

(56) References Cited

U.S. PATENT DOCUMENTS

| | | | | |
|---|---|---|---|---|
| 6,835,032 B1* | 12/2004 | Pozgay | ................... | B25F 5/02 |
| | | | | 409/181 |
| 6,962,265 B1 | 11/2005 | Zhang | | |
| 7,426,985 B2* | 9/2008 | Krulik | ................. | A45C 7/0031 |
| | | | | 190/103 |
| 2002/0125170 A1 | 9/2002 | Nyseth | | |
| 2004/0206664 A1* | 10/2004 | Nyseth | ............. | H01L 21/67383 |
| | | | | 206/710 |
| 2005/0115866 A1* | 6/2005 | Burns | ............. | H01L 21/67369 |
| | | | | 206/832 |
| 2005/0127080 A1* | 6/2005 | Schutz | ............. | B65D 25/2841 |
| | | | | 220/759 |
| 2008/0251415 A1* | 10/2008 | Yamagishi | ........ | H01L 21/67379 |
| | | | | 206/710 |
| 2016/0130037 A1* | 5/2016 | Ou | .......... | B25H 3/02 |
| | | | | 220/755 |
| 2016/0288958 A1* | 10/2016 | Hudachek | ............ | B65D 25/285 |
| 2019/0185211 A1* | 6/2019 | Silsby | .................. | A47J 45/067 |
| 2020/0216224 A1* | 7/2020 | Nichols | ................. | B65D 51/28 |

FOREIGN PATENT DOCUMENTS

| | | | | |
|---|---|---|---|---|
| JP | 2005256983 A | | 9/2005 | |
| JP | 2011129660 A | | 6/2011 | |
| JP | 2015012222 A | | 1/2015 | |
| KR | 20170140814 A | | 12/2017 | |
| TW | 509557 U | | 10/2015 | |
| WO | WO-0247118 A2 * | | 6/2002 | ....... H01L 21/67379 |
| WO | WO-2005041267 A2 * | | 5/2005 | ....... H01L 21/67379 |
| WO | 2012036432 A2 | | 3/2012 | |
| WO | WO-2016183376 A1 * | | 11/2016 | ......... H01L 21/6732 |

* cited by examiner

HANDLE FOR WAFER CARRIER

CROSS-REFERENCE TO RELATED APPLICATIONS

This application is a 371 National Phase Entry Application of International Application No. PCT/US2020/033784, filed May 20, 2020, which in turns claims priority to and the benefit of U.S. Provisional Application No. 62/851,983 filed, May 23, 2019, the entireties of which are incorporated herein by reference for all purposes.

TECHNICAL FIELD

This disclosure relates generally to a front opening substrate container. More specifically, this disclosure relates to a handle for a front opening substrate container.

BACKGROUND

A semiconductor device can be manufactured from a wafer substrate. The wafer substrate, or simply wafer, undergoes a series of fabrication steps. For example, fabrication steps can include, but are not limited to, material layer deposition, doping, etching, or chemically or physically reacting material(s) of the substrate. One or more wafers can be stored and transported in a front opening substrate container before, during, or after fabrication. In some fabrication steps, the wafers may be treated while still inside the front opening substrate container. The front opening substrate container protects the stored wafer(s) from physical damage (e.g., impacts) and contamination.

SUMMARY

This disclosure generally relates to a front opening substrate container used for storing or transporting wafers. More specifically, this disclosure relates to a handle for a front opening substrate container.

A handle for a wafer carrier is disclosed. The handle includes a body, an insertable member with a tab, and a locking mechanism with a flexible extension. The insertable member is configured to be inserted into an aperture of a wafer carrier. When in an engaged state, the insertable member is retained in the aperture. The locking mechanism is moveable between a locked state and an unlocked state. When in the locked state, the locking mechanism maintains the tab in the engaged state and the flexible extension is positioned to maintain the locking mechanism in the locked state.

In an embodiment, the tab is disposed on a first side of the insertable member. The insertable member includes a second side opposite to the first side, and the locking member extends along the second side when in the locked state.

In an embodiment, the handle includes a projection disposed at a first end of the body. The projection includes a first portion and a second portion that extend in different directions. The projection is configured engage a rail of the wafer carrier to help secure the handle to the wafer carrier.

A wafer carrier is disclosed. The wafer carrier includes an outer surface, a handle, and a locking mechanism. The wafer carrier also includes a protrusion that extends from the outer surface. An aperture is defined by the protrusion and is between the outer surface and an extent of the protrusion. The handle is attached to the outer surface of the wafer carrier and includes a body. The body includes an insertable member that extends into the aperture of the wafer carrier to secure the handle to the outer surface. The insertable member includes a tab that retains the insertable member in the aperture when in an engaged state. The locking mechanism includes a flexible member and is moveable relative to the insertable member between a locked state and an unlocked state. When in the locked state, the locking mechanism maintains the tab in the engaged state and the flexible extension maintains the locking mechanism in the locked state.

In an embodiment, the locking mechanism moves from the unlocked state to the locked state in a direction that is parallel to the direction in which the insertable member is inserted into the aperture.

In an embodiment, the wafer carrier includes a rail that extends along its outer surface, and the handle includes a projection disposed at a first end of the body of the handle. The projection is configured to engage the rail of the wafer carrier to help secure the handle. In an embodiment, the projection is moved to engage the rail in the same direction as the insertable member is inserted into the aperture of the wafer carrier. In an embodiment, the engagement of the projection and the rail inhibits movement of the handle away from or towards the first side of the wafer carrier.

In an embodiment, the wafer carrier is a front opening unified pod (FOUP). In an embodiment, the wafer carrier is a front opening shipping box (FOSB).

BRIEF DESCRIPTION OF THE DRAWINGS

The disclosure may be more completely understood in consideration of the following description of various illustrative embodiments in connection with the accompanying drawings.

Figure 1:
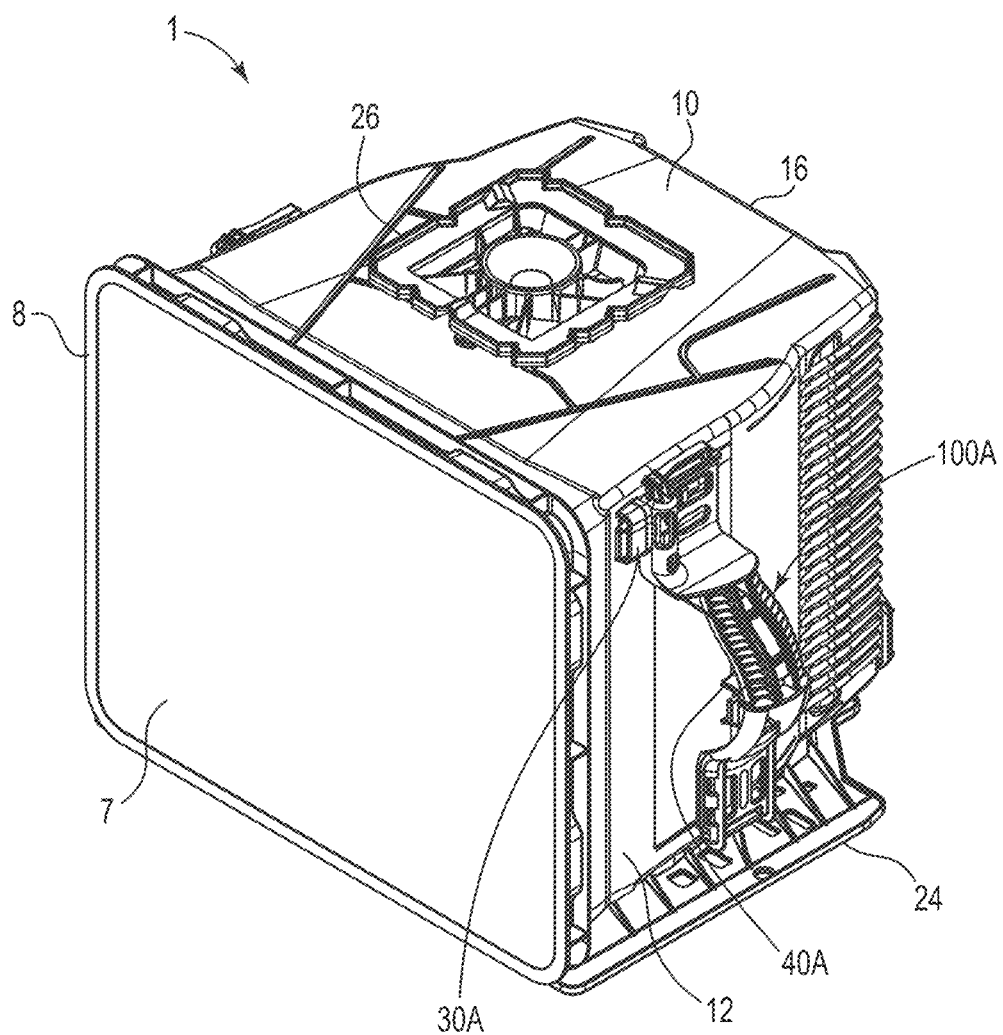
FIG. 1 is a right perspective view of a wafer carrier according to an embodiment of the disclosure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DETAILED DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The term "about" generally refers to a range of numbers that is considered equivalent to the recited value (e.g., having the same function or result). In many instances, the term "about" may include numbers that are rounded to the nearest significant figure.

Numerical ranges expressed using endpoints include all numbers subsumed within that range (e.g. 1 to 5 includes 1, 1.5, 2, 2.75, 3, 3.80, 4 and 5).

The following detailed description should be read with reference to the drawings in which similar elements in different drawings are numbered the same. The detailed description and the drawings, which are not necessarily to scale, depict illustrative embodiments and are not intended to limit the scope of the invention. The illustrative embodiments depicted are intended only as exemplary. Selected features of any illustrative embodiment may be incorporated into an additional embodiment unless clearly stated to the contrary.

A semiconductor device is formed by fabricating a wafer substrate. One or more wafer substrates, or simply wafers, can be stored within a wafer carrier during, before, or after fabrication. The front opening substrate container protects the wafer(s) within the wafer carrier during storage or transport. For example, a wafer carrier protects the wafer(s) from damage caused by impacting other objects and from impacting each other. For example, a wafer carrier may be configured to minimize or prevent contaminated air from entering the wafer carrier when the front of the wafer carrier is closed. The wafer carrier has a size and weight that allows for a person (e.g., a technician, handler, etc.) to carry it between locations.

The wafer carrier may be, for example but not limited to, a front opening unified pod (FOUP) or a front opening shipping box (FOSB). Generally, a FOUP is used to transport substrate wafers within a manufacturing facility, while a FOSB is used for transporting substrate wafers across longer distances (e.g., between manufacturing facilities, from a manufacturing facility to another facility). For example, a FOUP may be configured to prevent contaminated air from entering the FOUP when the front of the FOUP is open. For example, a FOUP may also be configured to selectively allow gases into the FOUP, such as, but are not limited to, processes gas for fabrication or filtered gas for creating a positive air pressure within the FOUP.

Embodiments disclosed are directed to a wafer carrier that includes handles. The handles allow a person to safely carry the wafer carrier. Advantageously, the wafer carrier disclosed includes handles having, among other features, a locking mechanism and rails that reduce the risk of accidental detachment of the handles and reduce an amount of flexion/deformation of the wafer carrier when carried, thereby increasing a security of the contents of the wafer carrier.

The locking mechanism prevents the accidental removal of the handles from the wafer carrier. The handles advantageously can be installed with a force applied to the wafer carrier that is relatively lower than prior configurations, which can, for example, result in damage to the wafer carrier. The handles in this disclosure allow for a structure with increased strength over integrally formed handles and for separate cleaning of the handle that increases wafer carrier cleanliness.

Figure 2:
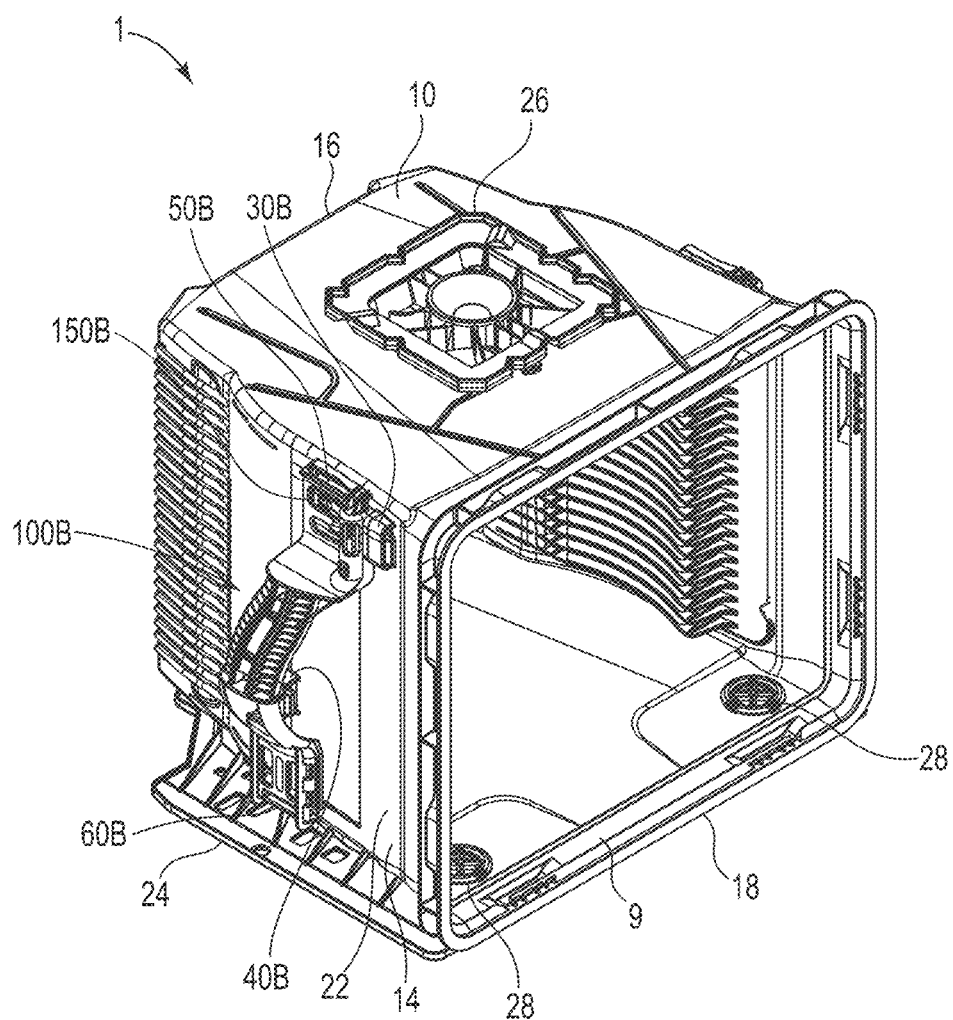
FIG. 2 is a left perspective view of the wafer carrier shown in FIG. 1 without a front door.
Figure 3:
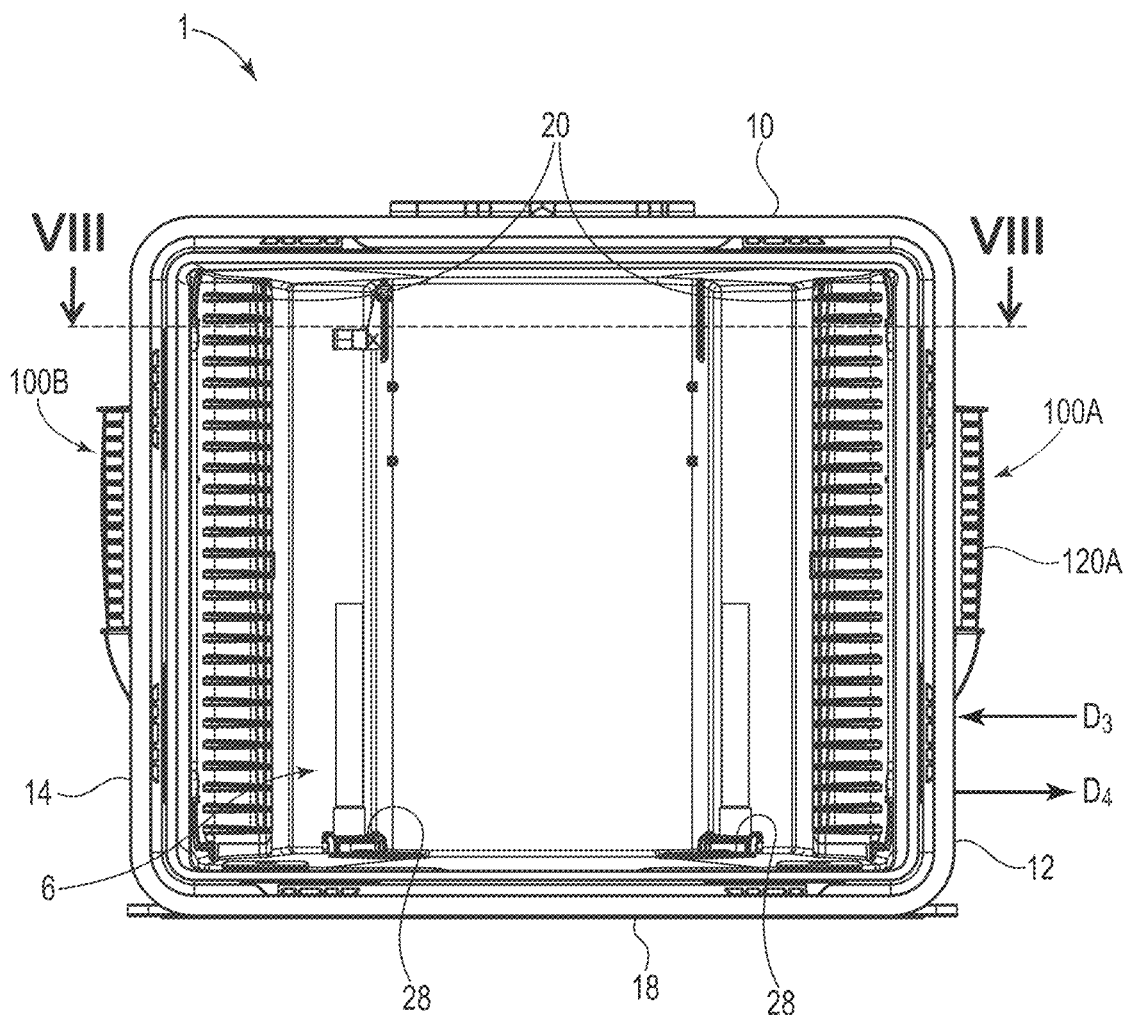
FIG. 3 is a front view of the wafer carrier shown in FIG. 1 without a front door.

FIGS. 1-4 show a wafer carrier according to an embodiment. The wafer carrier shown in FIGS. 1-4 is an embodiment of a wafer carrier 1. FIG. 1 is a right perspective view of the wafer carrier 1. FIG. 2 is a left perspective view of the wafer carrier 1. FIG. 3 is a front view of the wafer carrier 1.

Figure 4:
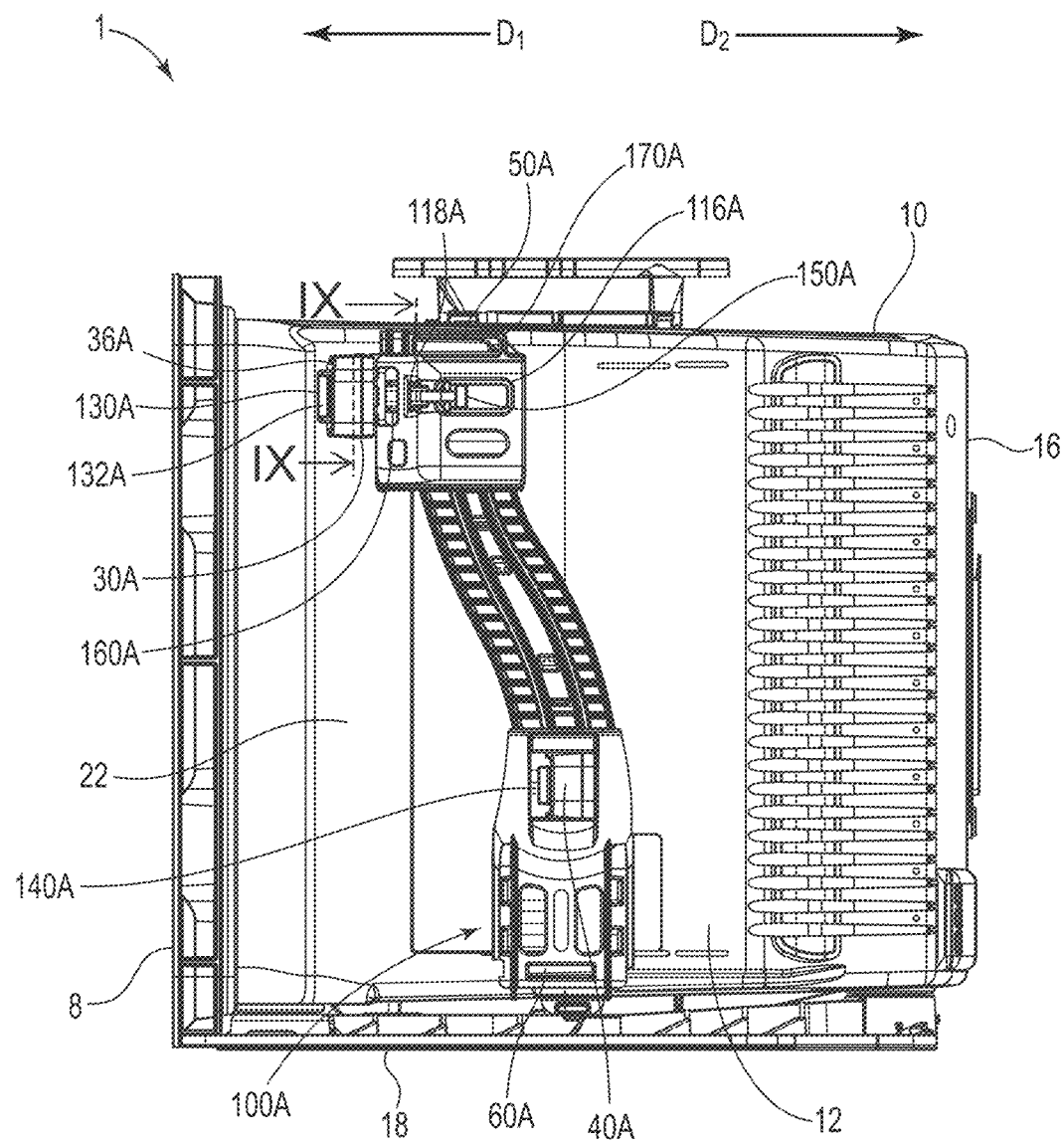
FIG. 4 is a side view of the wafer carrier shown in FIG. 1 without a front door.

FIG. 4 is a side view of the wafer carrier 1. According to various embodiments wafer carrier 1 can be a FOUP. In other embodiments, wafer carrier 1 can be a FOSB.

The wafer carrier 1 includes a first handle 100A, a second handle 100B (FIG. 2), a first locking mechanism 150A for the first handle 100A (FIG. 4), and a second locking mechanism 150B for the second handle 100B (FIG. 2).

Each handle 100A, 100B are preferably configured to be non-destructively detachable. The handles 100A, 100B have the same structure and are configured to be attached or detached in the same manner, except for being mirror images of each other. Features of the first handle 100A and first locking mechanism 150A are described and labeled in the drawings with the suffix "A", while features of the second handle 100B and the second locking mechanism 100B are described and labeled in the drawings with the suffix "B". Unless specifically described or shown otherwise, it should be understood that the handle 100B and locking mechanism 150B include a corresponding "B" feature for each "A" feature described or shown for the handle 100A and the locking mechanism 150A, respectively.

The wafer carrier 1 includes a front door 7, and a top 10, a right side 12 (FIGS. 1 and 4), a left side 14 (FIG. 2), a rear 16, and a bottom 18 that are generally referred to as sides 10, 12, 14, 16, 18. The front door 7 and sides 10, 12, 14, 16, 18 form an enclosed internal space 6 (FIG. 3). The wafer carrier 1 has a front opening 9 (FIG. 2) at the front 8 of the wafer carrier 1. The front door 7 covers the front opening 7 (FIG. 1) and the wafer carrier 1 can be accessed by moving (e.g., opening, removing) the front door 7. FIGS. 2 and 3 illustrate the wafer carrier 1 with the front door 7 removed (e.g., opened).

The sides 10, 12, 14, 16, 18 and the front door 7, define an outer surface 22 of the wafer carrier 1. In an embodiment, the sides 10, 12, 14, 16, 18 are a single integral structure. For example, the sides 10, 12, 14, 16, 18 may be molded as a single continuous piece of material or from multiple pieces that are permanently bonded together. In an embodiment, the wafer carrier 1 is made of a material that is generally unreactive and containment resistant (e.g., having low permeability) such as, but not limited to, a high purity polycarbonate.

As shown in FIG. 3, wafer teeth 20 are disposed within the wafer carrier 1 for storing a plurality of wafers (not shown) in the internal space 6. The wafers are inserted into the spaces of the wafer teeth 20 and stacked in a vertical direction with respect to the page within the wafer carrier 1. In an embodiment, the wafer carrier 1 may include a different structure known for holding wafer(s) within the internal space 6 of the wafer carrier 1 other than the wafer teeth 20 shown. The front door 7 covers the front opening 9 of the wafer carrier 1 to enclose the internal space 6. The wafers are protected within the internal space 6 by the wafer carrier 1. The front door 7 is configured to seal with the sides 10, 12, 14, 18 to prevent air from leaking into internal space 6 of the wafer carrier 1 and contaminating the stored wafers.

The top 10 includes an automation interface 26 and the bottom 18 includes a base 24. The automation interface 26 may also be referred to as a top handling flange. In an embodiment, the automation interface 26 allows a standard automated attachment (not shown) for moving the wafer carrier 1, such as but not limited to an automated arm, to be connected to the wafer carrier 1. For example, the automated arm may be used to move the wafer carrier 1 between different fabrication equipment. The handles 100A, 100B are configured not to extend into the volume around the wafer carrier 1 typically reserved for the automated attachment. In an embodiment, the base 24 can be for connecting the wafer carrier 1 to different fabrication equipment.

In an embodiment, the wafer carrier 1 may include one or more ports 28. For example, a port 28 may be an inlet for providing gas into the wafer carrier 1 (e.g., opened when a port 28 is fluidly connected to a fluid source) or an outlet (e.g., a purge) for allowing gas to flow out of the wafer carrier 1. For example, a port 28 may be an inlet for creating a positive pressure within the wafer carrier 1 when the front door 7 is open or for circulating one or more process gases through the wafer carrier 1 in a fabricating step. For example, the base 24 is connected (e.g., placed on, attached, etc.) to the appropriate fabrication equipment (not shown) at the different fabrication steps, and gas is injected into and circulated through the wafer carrier 1 via the ports 28.

The first handle 100A is attached to one side 12 of the wafer carrier 1 (FIG. 1) and the second handle 100B is attached to a different side 14 of the wafer carrier 1 (FIG. 2). The handles 100A, 100B allow for a person to carry the wafer carrier 1 between locations by hand.

The wafer carrier 1 is configured to prevent accidental detachment of the handles 100A, 100B. Each of the handles 100A, 100B includes a locking mechanism 150A, 150B (FIGS. 2 and 4) configured to prevent accidental detachment of its respective handle 100A, 100B from the wafer carrier 1. For example, the accidental detachment of a handle 100A, 100B from the wafer carrier 1 while being carried can cause the wafer carrier 1 to be dropped and the wafer(s) stored in the wafer carrier 1 to be damaged.

Figure 5:
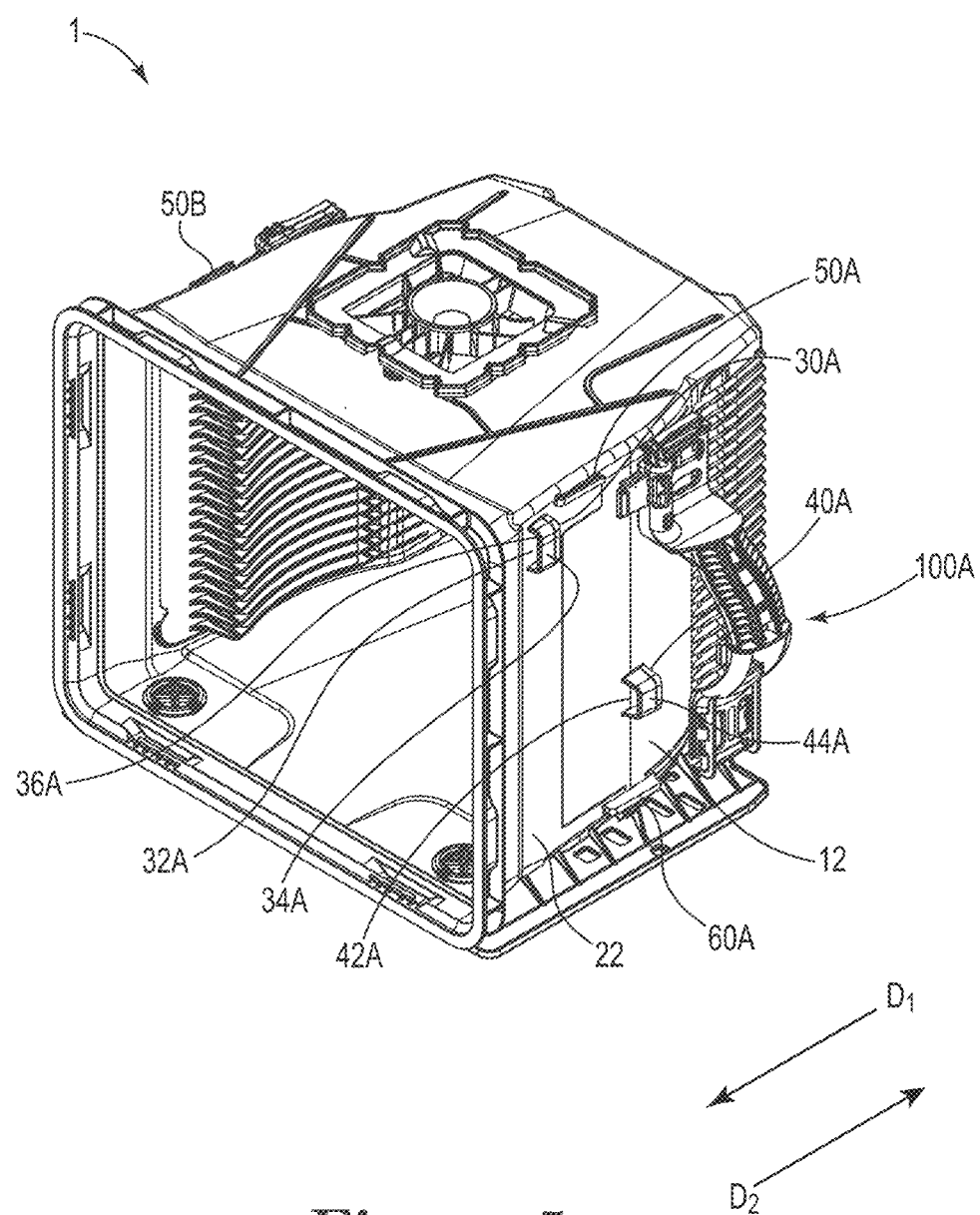
FIG. 5 is a right perspective view of the wafer carrier shown in FIG. 1 with the handle detached.

FIG. 5 is a right perspective view of the wafer carrier 1 with the handle 100A detached. When attached (FIG. 1), the handle 100A extends along the side 12 of the wafer carrier 1.

As shown in FIG. 5, The wafer carrier 1 includes protrusions 30A, 40A, and rails 50A, 60A provided along the side 12. The protrusions 30A, 40A each extend from the outer surface 22 of the wafer carrier 1. The handle 100A is secured to the wafer carrier 1 via the protrusions 30A, 40A, and the rails 50A, 60A. As shown in FIG. 2, protrusions 30B, 40B and rails 50B, 60B are provided along the opposite side 14 of the wafer carrier 1 for securing the second handle 100B to the wafer carrier 1.

Apertures 32A, 42A are formed by the protrusions 30A, 40A. The aperture 32A is defined by the protrusion 30A and is located between the outer surface 22 of the wafer carrier 1 and an extent 34A of the protrusion 30A. The aperture 42A is defined by the protrusion 40A and is located between the outer surface 22 of the wafer carrier 1 and an extent 44A of the protrusion 40A. Each aperture 32A, 42A extends along the side 12 of the wafer carrier 1 from the front 8 to the rear 16 of the wafer carrier 1.

Figure 6A:
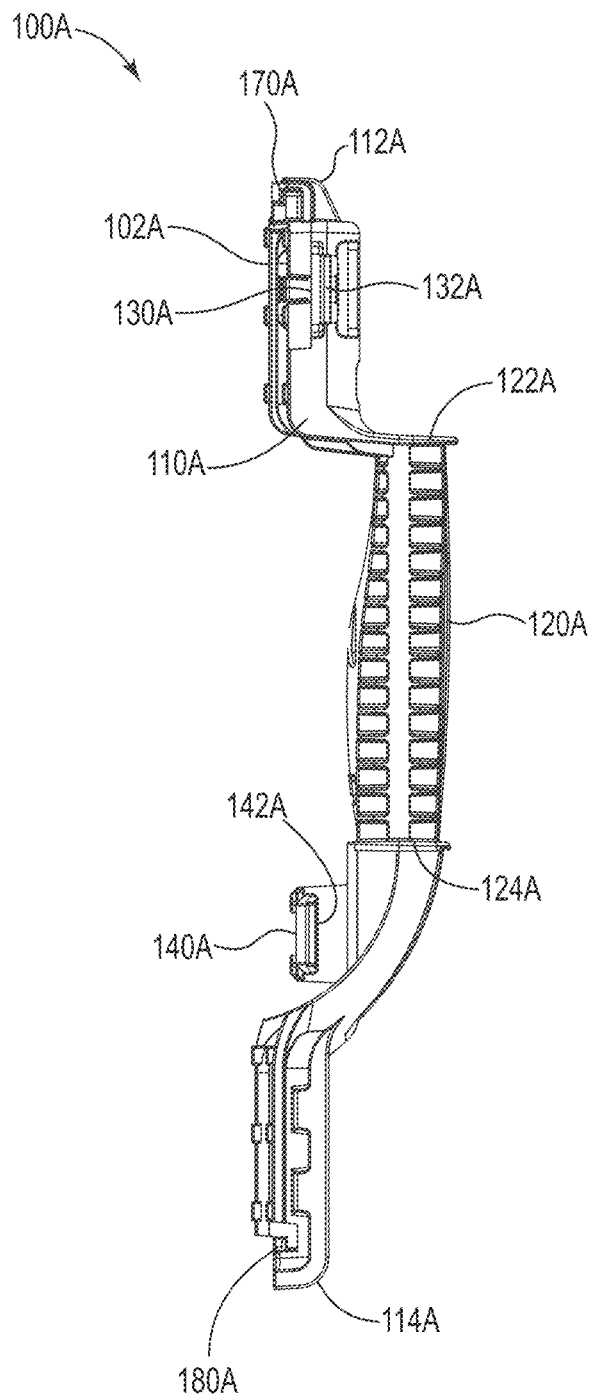
FIG. 6A is a side view of a detachable handle for a wafer carrier according to an embodiment.
Figure 6B:
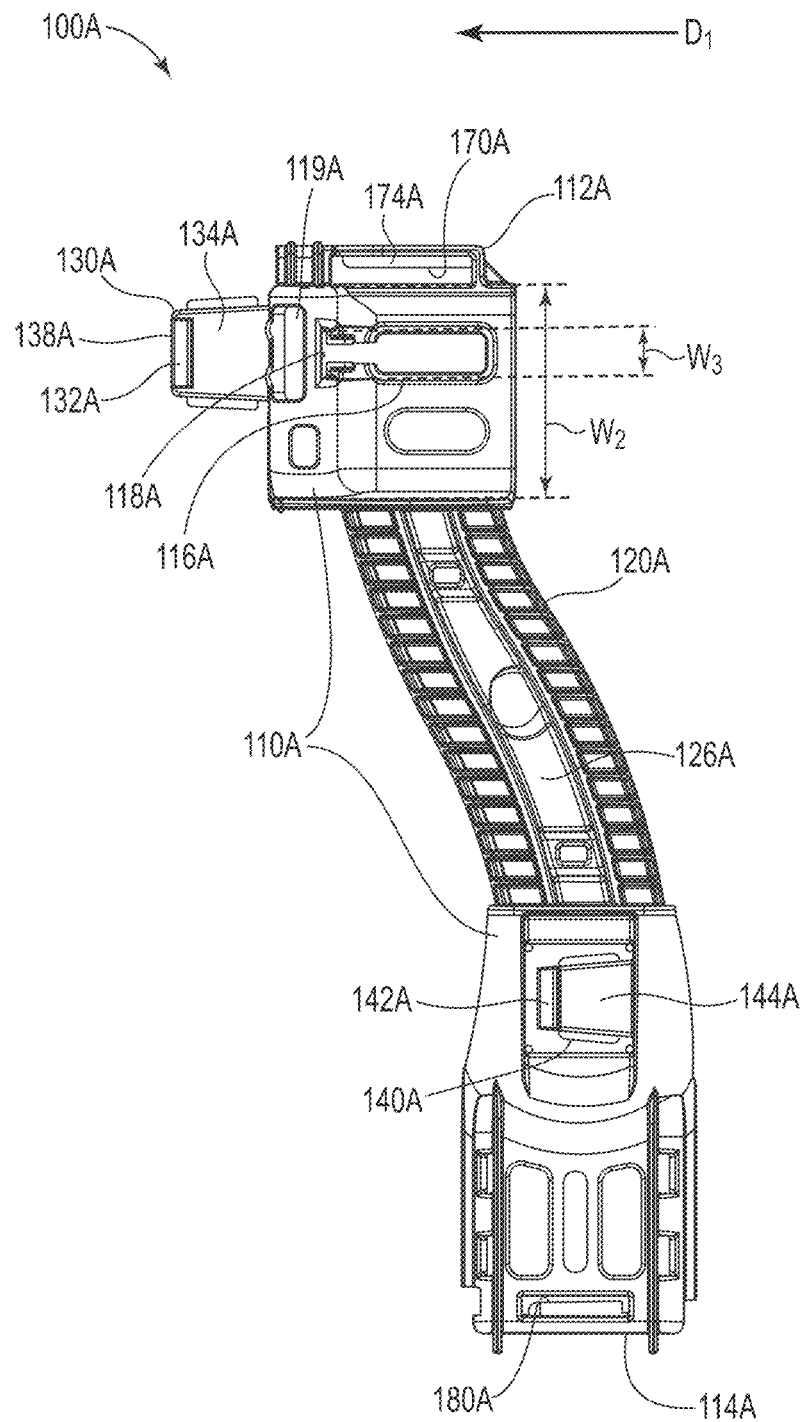
FIG. 6B is a front view of the detachable handle shown in FIG. 6A.
Figure 6C:
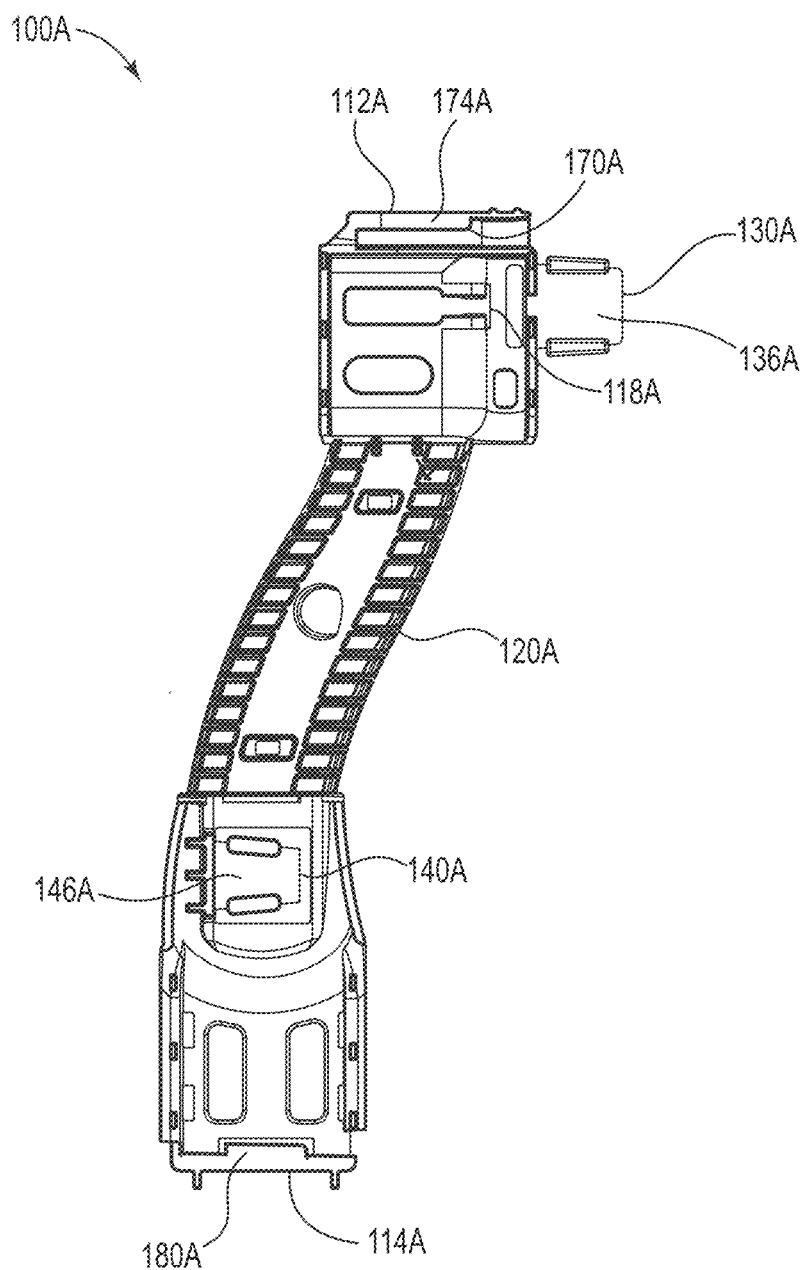
FIG. 6C is a rear view of the detachable handle in shown in FIG. 6A.

FIGS. 6A-6C are views of the handle 100A according to an embodiment. FIG. 6A is a side view of the handle 100A. FIG. 6B is a front view of the handle 100A. For example, FIG. 4 and FIG. 6B are similar viewpoints of the handle 100A. FIG. 6C is a rear view of the handle 100A.

The handle 100A includes a body 110A with a first end 112A and a second end 114A. A grip 120A is disposed between the first end 112A and the second end 114A of the body 110A. As shown in FIG. 6A, the grip 120A has a first end 122A that is closer to the first end 112A of the body 110A and a second end 124A that is closer to the second end 114A of the body 110A.

When the handle 100A is attached to the outer surface 22 of the wafer carrier 1, the handle 100A is configured for a person to grab the grip 120A of the handle 100A to carry the wafer carrier 1. The grip 120A is configured to be easy to grasp and handle when the handle 100A is attached to the side 12. For example as shown in FIGS. 1 and 3, the grip 120A is spaced apart from the side 12 and extends in a direction that allows for adequate space for a person to grab and hold the grip 120A. As shown in FIGS. 6A-6C, the grip 120A defines a portion of the body 110A of the handle 100A.

In an embodiment, the grip 120A may include a color indicator 126A (FIG. 6B). For example, a color indicator may be used to indicate the contents of the wafer carrier 1 (e.g., the specific type of wafer contained in the wafer carrier 1, the current fabrication stage of the wafers in the wafer carrier 1, or the like). In an embodiment, the color indicator 126A may be integral to the body 110A of the handle 100A to avoid forming difficult cleaning surfaces (e.g., cracks, grooves, etc.) as the detachability of handles 100A, 100B allows for the handles 100A, 100B to be replaced when a different color indicator for the wafer carrier 1 is desired. For example, the color indicator 126A in such an embodiment may be provided by coloring of the body 110A itself or by a colored material being integrally formed in the body 110A.

The handle 100A also includes a first insertable member 130A and a second insertable member 140A. As shown in FIG. 6A, the first insertable member 130A is located between the first end 112A and the grip 120A. In an embodiment, the first insertable member 130A may be disposed at the end 122A of the grip 120A, at the first end 112A, or between the first end 112A and the grip 120A. The insertable member 130A includes a tab 132A, a front side 134A, and a back side 136A that is opposite the front side 134A. The tab 132A is on the front side 134A of the insertable member 130A and extends away from the front side 134A of the insertable member 130A. The insertable member 130A has an end 138A (FIGS. 6B and 8C) that is opposite to the body 110A. In an embodiment, the tab 132A is located on the front side 134A of the insertable member 130A closer to the end 138A than to the body 110A. For example, the tab 132A is located on the front side 134A and extends along the end 138A.

As shown in FIG. 6A, the second insertable member 140A is disposed between the grip 120A and the second end 114A. In an embodiment, the second insertable member 140A may be disposed at the end 124A of the grip 120A, at the second end 114A, or between the second end 114A and the grip 120A. Similar to the first insertable member 130A, the second insertable member 140A also includes a tab 142A, a front side 144A, and a back side 146A. In an embodiment, one or both of the first insertable member 130A and the second insertable member 140A may be integral with the body 110A (e.g., formed as a single continuous piece of material). For example, handle 100A when molded (e.g., injection molded) includes at least the body 110A and the insertable member 130A formed as a single piece. In such an embodiment, the insertable member 130A is formed to have the desired amount of flexibility relative to the body 110A for allowing attachment and detachment of the handle 100A as described below.

In an embodiment, the insertable members 130A, 140A are located along portions of the body 110A different from the grip 120A (i.e., not located along the grip 120A). This can provide space for grabbing the grip 120A and can help prevent a person from accidentally contacting one of the insertable members 130A, 140A when handling the grip 120A. For example, such accidental contact may eventually damage or loosen the insertable members 130A, 140A.

The handle 100A also includes a first projection 170A and a second projection 180A. The first projection 170A is located at the first end 112A of the body 110A. As shown in FIG. 4, the first projection 170A is configured to be even or below the outer surface 22 of the top 10 of the wafer carrier 1, when the wafer carrier 1 is viewed from the side. For example, the first projection 170A is configured not to extend above the outer surface 22 of the top 10 of the wafer carrier 1. This prevents the projection 170A from interfering with the space in which the standard automated attachment operates when attaching to the automation interface 26 or when attached to the automation interface 26. The second projection 180A is located at the second end 114A of the body 110A. The first projection 170A is configured to engage first rail 50A of the wafer carrier 1. The second projection 180A is configured to engage with the second rail 60A of the wafer carrier 1.

FIG. 1 shows the handle 100A attached to the outer surface 22 of the wafer carrier 1 while FIG. 5 shows the handle 100A when detached. As shown by comparing FIGS. 1 and 5, the handle 100A is attached by moving the detached handle 100A (as shown in FIG. 5) in a first direction $D_1$ relative to the wafer carrier 1. In an embodiment, the first direction $D_1$ extends from the rear 16 to the front 8 of the FOUP. For example, the first direction $D_1$ may be generally parallel to the side 12 of the wafer carrier 1. As the handle 100A is moved in the first direction $D_1$ relative to the wafer carrier 1, each of the insertable members 130A, 140A is inserted into its corresponding aperture 32A, 42A and each projection 170A, 180A is engaged with a corresponding one of the rails 50A, 60A. The inserted insertable members 130A, 140A and engaged projections 170A, 180A secure the handle 100A to the wafer carrier 1. Detachment of the attached handle 100A (as shown in FIG. 4) includes moving the handle 100A in a direction $D_2$ opposite the first direction $D_1$. Detachment of the attached handle 100A is described in more detail below.

The insertable member 130A is configured to flex relative to the body 110A (i.e., bend relative to the body 110A). More specifically, the insertable member 130A is configured to flex in a direction perpendicular to the direction $D_1$ in which it extends from the body 110A (e.g., in a direction into or out of the page in FIG. 6B). In an embodiment, this flexible configuration allows for (repeated) flexion of insertable member 130A towards and away from the outer surface 22 of the wafer carrier 1. In an embodiment, when the insertable member 130A is inserted into the aperture 32A, the tab 132A contacts the protrusion 30A and the insertable member 130A is forced to flex towards the outer surface 22 of the wafer carrier 1 for the insertable member 130A to fit into the aperture 32A. For example, the flexion of the insertable member 130A allows for the insertion of the insertable member 130A into the aperture 32A. Accordingly, as the insertable member 130A is moved to and into the aperture 32A, the tab 132A contacts the protrusion 30A which applies a pressure to the insertable member 130A and flexes the insertable member 130A towards the outer surface 22 of the wafer carrier 1.

Once the tab 132A passes through the aperture 32A, the tab 132A is flexed to be farther away from the outer surface 22 of the wafer carrier 1. More specifically, the tension of the flexed insertable member 130A flexes the tab 132A to be farther away from the outer surface 22 of the wafer carrier 1. The flexing of the tab 132A puts the tab 132A into an engaged state. The tab 132A in the engaged state retains the insertable member 130A in the aperture 32A. More specifically, the tab 134A in its engaged state prevents the insertable member 130A from being removed from the aperture 32A. The tab 132A prevents removal of the insertable member 130A by contacting the front outer surface 36A (FIG. 4) of the protrusion 30A when the handle 100A moved (e.g., pulled) in the direction $D_2$ opposite to the insertion direction $D_1$. For example, the tab 132A is hooked on front outer surface 36A of the protrusion 30A. As shown in FIG. 4, the front outer surface 36A faces away from the body 110A of the handle 100A (e.g., in direction $D_1$).

In an embodiment, the tab 132A also has an unengaged state. The tab 132A is configured to allow removal of the insertable member 130A from the aperture 32A when in the unengaged state. For example, the tab 132A in the unengaged state allows movement of the insertable member 130A relative to the protrusion 30A in the direction $D_2$ opposite to the insertion direction $D_1$. In an embodiment, the wafer carrier 1 is configured to allow detachment of the handle 100A when all of the tab(s) 132A, 142A of the insertable member(s) 130A, 140A of the handle 100A are in the unengaged state.

The movement of the handle 100A that inserts the insertable member 130A into the apertures 32A (e.g., the movement in the first direction $D_1$) also moves the first projection 170A relative to the first rail 50A and the second projection 180A relative to the second rail 60A. More specifically, this movement of the handle 100A causes the first projection 170A to engage the first rail 50A and the second projection 180A to engage the second rail 60A. The engagement of each projection 170A, 180A with its corresponding rail 50A, 60A is configured to prevent movement of the handle 100A away from the wafer carrier 1 (e.g., direction $D_3$ in FIG. 3). For example, the engagement of a projection 170A, 180A, with its rail 50A, 60A can mitigate force(s) that pull the handle 100A away from the side 12 of the wafer carrier 1 and outward deflection of the side 12 by distributing pulling forces to the corners of the wafer carrier 1.

The insertable member 140A and tab 142A are inserted in corresponding protrusion 40A and aperture 42A of the wafer carrier 1 in a similar manner to the insertable member 130A and the tab 132A. In an embodiment, the handle 100A may be configured such that the one movement in the first direction $D_1$ of the handle 100A inserts the insertable members 130A, 140A and engages the projections 170A, 180A. In an embodiment, the handle 100A may be configured such that the one movement in the first direction $D_1$ of the handle 100A inserts the insertable members 130A, 140A, moves the tabs 132A, 142A into an engaged state, and engages the projections 170A, 180A.

Figure 7:
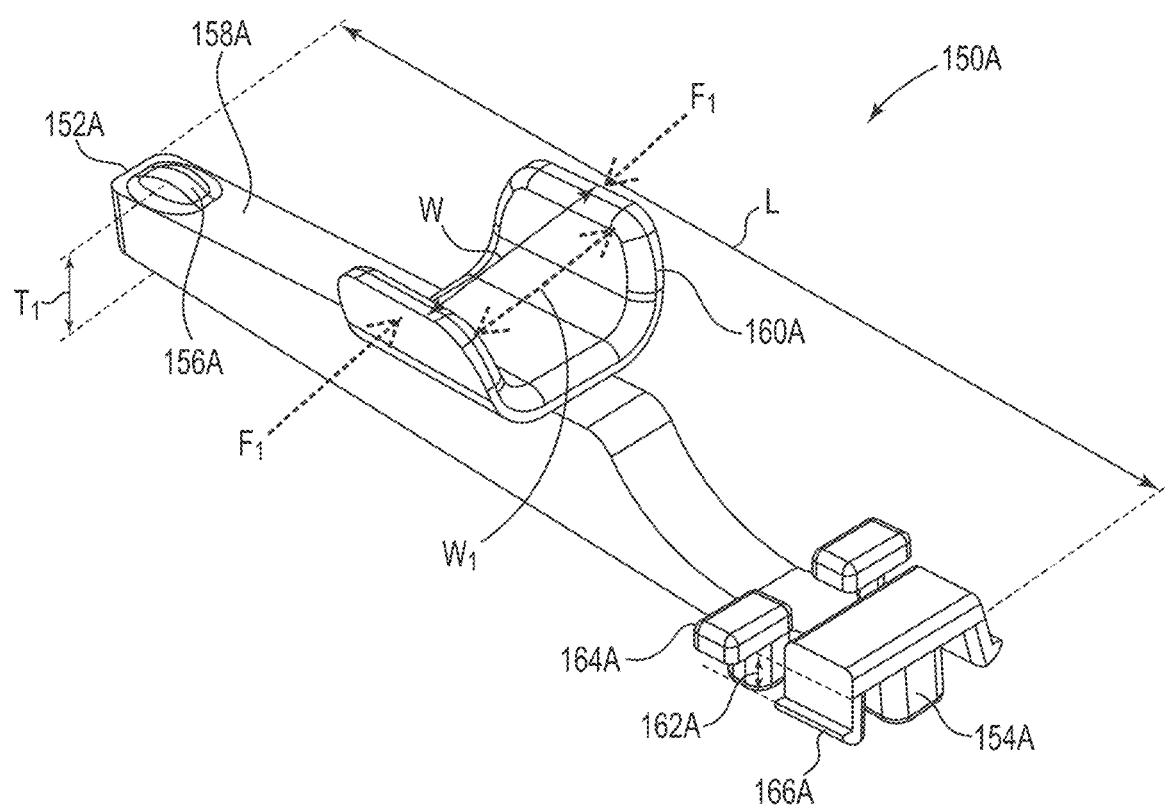
FIG. 7 is a perspective view of a locking mechanism for a detachable handle of a wafer carrier according to an embodiment.

FIG. 7 is a perspective view of a locking mechanism 150A according to an embodiment. The locking mechanism 150A is configured to prevent unintended detachment of the handle 100A from the wafer carrier 1. For example, the locking mechanism 150A when in a locked state is configured to ensure that that accidental contact with an insertable member 130A, 140A or a force on the handle 100A (e.g., weight of a full wafer carrier 1, jostling of the wafer carrier 1, etc.) are unable to force the tab 132A from its engaged state.

The locking mechanism 150A includes a front end 152A, a rear end 154A, a contact surface 156A, and a flexible extension 160A. The locking mechanism 150A also has a length L that extends from the front end 152A to the rear end 154A. The contact surface 156A is located between the front end 152A of the locking mechanism 150A and the flexible extension 160A. In an embodiment, a largest thickness $T_1$ of the locking mechanism 150A between the front end 152A and the flexible extension 160A is at the contact surface 156A. The thickness $T_1$ of the locking mechanism 150A is perpendicular to its length L.

As shown in FIG. 4, the locking mechanism 150A is retained in a guide 116A of the body 110A of the handle 100A. The locking mechanism 150A is retained in the guide 116A so as to be slidably attached to the body 110A. For example, the guide 116A allows the locking mechanism 150A to move along the first direction $D_1$ while preventing the locking mechanism 150A from moving in directions perpendicular to the first direction $D_1$ (e.g., direction $D_3$, direction $D_4$ in FIG. 3, etc.). In an embodiment, the locking mechanism 150A includes an upper restriction 164A and a lower restriction 166A (FIG. 7). The locking mechanism 150A is slidably attached to the body 110A of the handle 100A by the guide 116A and the two restrictions 164A, 166A. The upper restriction 164A is positioned above the guide 116A (e.g., in a direction out of the page in FIG. 4, the guide 116A closer to the outer surface 22 than upper restriction 164A in FIG. 4) and the lower restriction 166A is positioned below the guide 116A (e.g., the lower restriction 166A closer to the outer surface 22 than the guide 116A in FIG. 4). For example, when the handle 100A is viewed from side (e.g., the view in FIG. 6A), the guide 116A is positioned between the upper restriction 164A and the lower restriction 166A. In an embodiment, one upper restriction 164A and one lower restriction 166A may be provided along each side of the locking mechanism 150A.

In an embodiment, one of the restrictions 166A is bendable (e.g., bendable in a direction of the width W) to allow the locking mechanism 150A to be formed separately from the handle 100A and then snapped into the guide 116A. The restrictions 164A, 166A are configured to prevent removal of the locking mechanism 150A after being snapped into the guide 116A. In another embodiment, the handle 100A may be formed (e.g., molded, etc.) with the locking mechanism 150A integral with the body 110A and in the guide 116A, and a portion connecting the locking mechanism 150A to the body 110A formed to be broken so that the locking mechanism 150A becomes slidably attached to the body 110A.

The body 110A of the handle 100A includes a through-hole 118A and a retaining space 119A. In an embodiment, the retaining space 119A is provided in a rear 102A (FIG. 6A) of the body 110A that faces the outer surface 22 of the side 12 of the wafer carrier 1 when the handle 100A is attached. For example, when the handle is 100A is attached to the side 12 of the wafer carrier 1, the retaining space 119A is located between the body 110A and the outer surface 22 of the side 12 of the wafer carrier 1. The through-hole 118A connects to the retaining space 119A. The through-hole 118A is adjacent to the insertable member 130A between the ends 112A, 114A of the body 110A of the handle 100A. The retaining space 119A is located between the through-hole 118A and the insertable member 130A. The locking mechanism 150A is configured to extend through the through-hole 118A into the retaining space 119A.

As shown in FIGS. 6A and 6C, the retaining space 119A is open along the rear 102A of the handle 100A. However, in an embodiment, the retaining space 119A may be enclosed along the rear 102A of the handle 100A. For example, in such an embodiment, a through-hole may extend through the body 110A, and the retaining space 119A may be a larger volume within the through-hole.

Figure 8A:
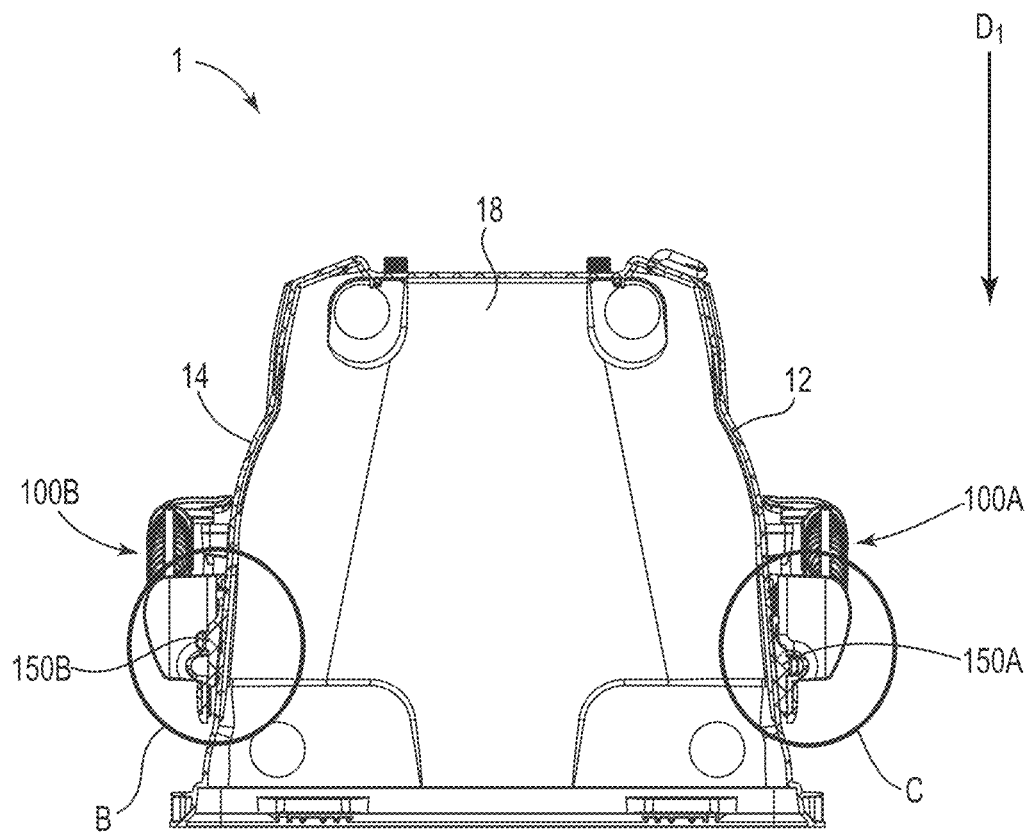
FIG. 8A is a sectional view of the wafer carrier shown in FIG. 3 along the line VIII-VIII.
Figure 8B:
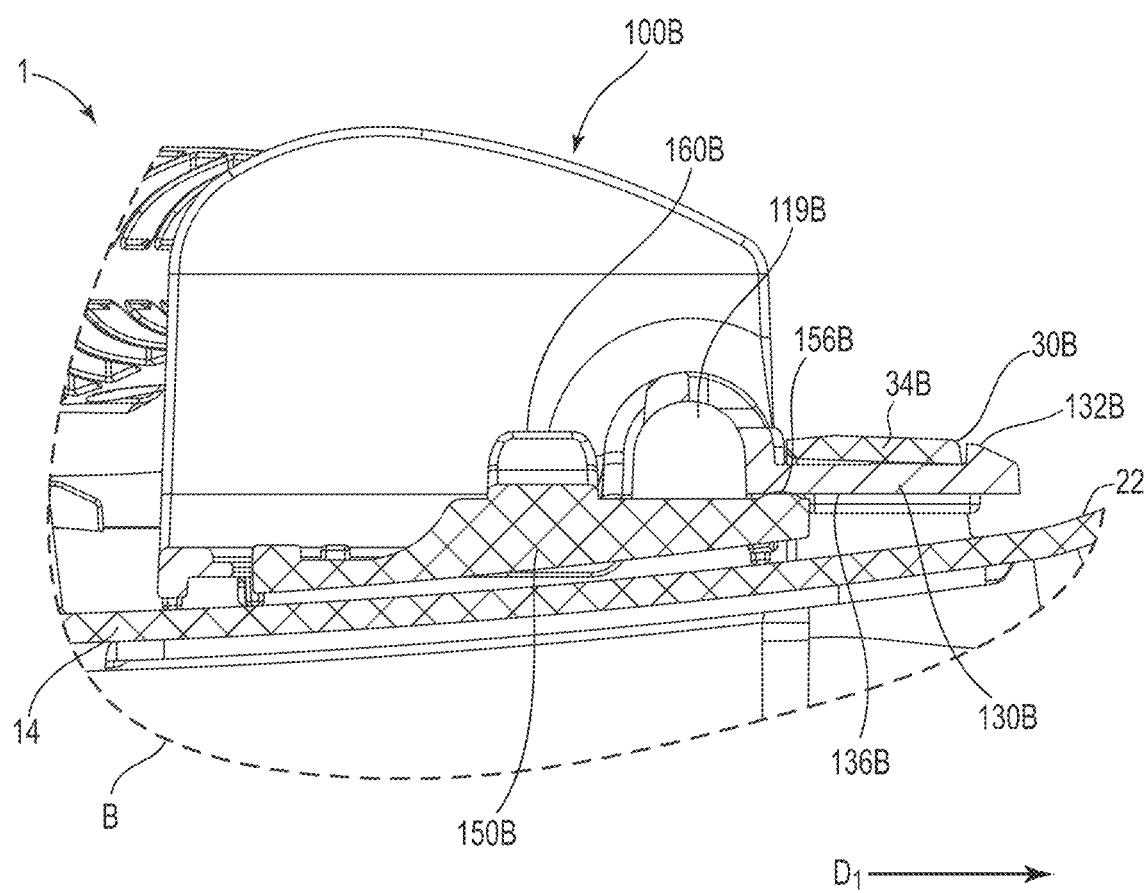
FIG. 8B is an enlarged view of the area B shown in FIG. 8A.
Figure 8C:
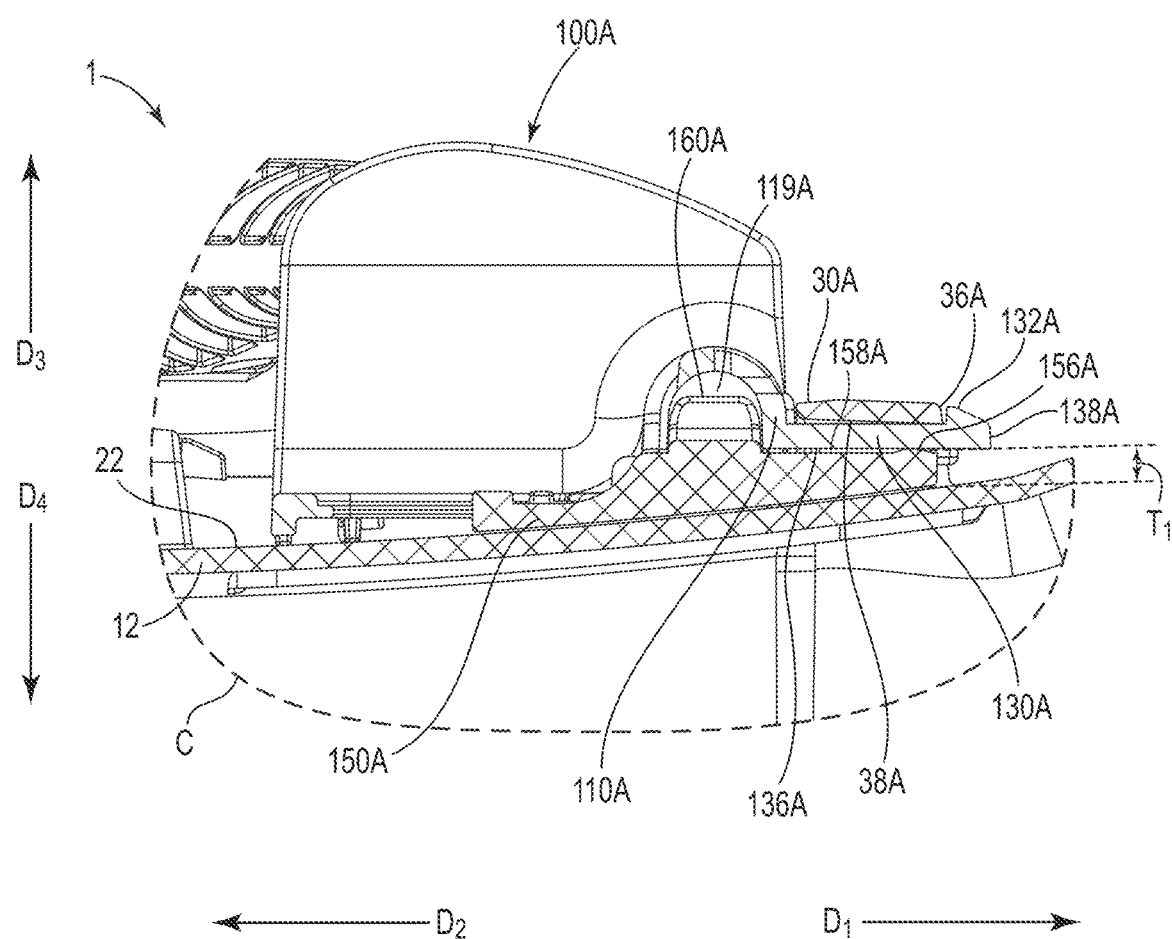
FIG. 8C is an enlarged view of the area C shown in FIG. 8A.

FIG. 8A is a sectional view of the wafer carrier 1 along the line VIII-VIII in FIG. 3. FIG. 8B is an enlarged view of area B in FIG. 8A. FIG. 8C is an enlarged view of area C in FIG. 8A. The area B as shown in FIG. 8B is inverted and rotated and the area C as shown in FIG. 8C is rotated relative to FIG. 8A for clarity and easier comparison.

The locking mechanism 150A has a locked state and an unlocked state. Each of the handles 100A, 100B includes a locking mechanism 150A, 150B (FIGS. 1 and 2). The locking mechanism 150A for the first handle 100A is shown in FIGS. 8A and 8C in the locked state. The locking mechanism 150B of the second handle 100B is shown in FIGS. 8A and 8B in the unlocked state. The locking mechanism 150B in FIG. 8B is moved from its unlocked state to the locked state (which is shown by the locking mechanism 150A in FIG. 8C) by moving in the first direction $D_1$. The locking mechanism 150A in FIG. 8C is moved from its locked state to the unlocked state (which is by shown by the locking mechanism 150A in FIG. 8B) by applying a force to the flexible extension 160A and then moving the locking mechanism 150A in the opposite direction $D_2$.

The locking mechanism 150A is configured to be moveable relative to the insertable member 130A. For example, the locking mechanism 150A is selectively moveable as the flexible extension 160A inhibits the movement of the locking mechanism 150A in the locked state until acted upon by an external force, as discussed in further detail below.

In FIG. 8B, the locking mechanism 150B is in the unlocked state. The locking mechanism 150B in the unlocked state allows the tab 132B to be moved from its engaged state. For example, the locking mechanism 150B allows the insertable member 130B to flex by an amount that moves the tab 132B from the engaged state. The contact surface 156B of the locking mechanism 150B may still contact the back surface 136B of the insertable member 130B when in the unlocked state. In another embodiment, the contact surface 156B may not contact the insertable member 130B when in the unlocked state. The locking mechanism 150B in its unlocked state allows the insertable member 130B to be flexed away from the protrusion 30B, which disengages the tab 132B from the protrusion 30B. In an embodiment, the locking mechanism 150B is in the locked state when the flexible member 160B is disposed external to the retaining space 119B. The locking mechanism 150B is moved in the direction $D_1$ and moves into the locked state when the flexible member 160B is located in the retaining space 119B.

In FIG. 8C, the tab 132A is in the engaged state and the locking mechanism 150A is in the locked state. For example, the tab 132A in FIG. 8C is positioned to contact the front outer surface 38A of the protrusion 30A when the handle 100A is moved (e.g., pulled) in the direction $D_2$, which prevents the insertable member 130A from being removed from the aperture 32A. The locking mechanism 150A in the locked state is configured to maintain the tab 132A in the engaged state. The tab 132A extends from the insertable member 130A in a first direction $D_3$, and is moved out of the engaged state by moving in the opposite direction $D_4$. The position of the locking mechanism 150A in the locked state prevents the tab 132A from moving from the engaged state. The position of the contact surface 156A of the locking mechanism 150A in the locked state limits the tab 132A from moving in the opposite direction $D_4$ by limiting the flexion of the insertable member 130A. For example, the position of the contact surface 156A of the locking mechanism 150A in the locked state prevents removal of the tab 132A from the engaged state. In an embodiment, the contact surface 156A of the locking mechanism 150A contacts the insertable member 130A when the locking mechanism 150A is in the locked state. This contact by the locking mechanism 150A prevents flexion of the insertable member 130A. In an embodiment, the locking mechanism 150A may maintain the tab 132A in the engaged state without contacting the insertable member 130A. For example, a minimum amount of flexion of the insertable member 130A is necessary to move the tab 132A from the engaged state. The contact surface 156A of the locking mechanism 150A in the locked state prevents the insertable member 130A from reaching the minimum amount of flexion.

The locking mechanism 150A extends into the aperture 32A and along the back side 136A of the tab 132A. The insertable member 130A is disposed between the contact surface 156A of the locking mechanism 150A and the inner surface 38A of the protrusion 30A. The thickness $T_1$ of the locking mechanism 150A maintains the tab 132A in the engaged state by limiting the flexion of the insertable member 130A. The thickness $T_1$ of the locking mechanism 150A in FIG. 8C stops the insertable member 130A from flexing and moving the tab 132A. The thickness $T_1$ extends perpendicular to the direction $D_1$ in which the insertable member 130A extends from the body 110A of the handle 100A into aperture 32A.

The flexible extension 160A is configured to be flexible by an external force $F_1$ (e.g., bendable relative to the rest of the locking mechanism 150A). For example, the external force $F_1$ can be applied by a person wanting to move the locking mechanism 150A. The retaining space 119A can prevent accidental contact from applying the external force $F_1$ to the flexible extension 160A. The positioning of the flexible extension 160A prevents movement of the locking mechanism 150A in the direction $D_2$ opposite to the first direction $D_1$.

The locking mechanism 150A is selectively movable as the flexible extension 160A is configured to limit movement of the locking mechanism 150A from the locked state unless flexed by the external force $F_1$. The locking mechanism 150A moves from the unlocked state to the locked state by moving in the direction $D_1$. The movement of the locking mechanism 150A in the first direction $D_1$ moves the flexible extension 160A through the through-hole 118A and into the retaining space 119A. In an embodiment, the locking mechanism 150A enters the locked state when the flexible extension 160A is positioned in the retaining space 119A.

The size of the retaining space 119A relative to the through-hole 118A allows the flexible extension 160A to at least partially un-flex. The normal geometry of the flexible extension 160A within the retaining space 119A (i.e., when not being acted on by the external force $F_1$) is unaligned (e.g., match, fit within) with the through-hole 118A in the direction $D_2$. This non-alignment prevents the flexible extension 160A from fitting into the through-hole 118A and prevents movement of the locking mechanism 150A in the direction $D_2$ that would move the locking mechanism 150A from the locked position. Thus, the position of the flexible extension 160A in the retaining space 119A maintains the locking mechanism 150A in the locked state. The external force $F_1$ flexes the flexible extension 160A and causes the flexible extension 160A to align with the through-hole 119A in the direction $D_2$, which allows the flexible extension 160A to fit into the through-hole 118A. Accordingly, the locking mechanism 150A is moved from the locked state to the unlocked state by applying the external force $F_1$ to the flexible extension 160A and moving locking mechanism 150A in the direction $D_2$, which moves the flexible extension 160A into the through-hole 118A from the retaining space 119A. In an embodiment, the locking mechanism 150A enters the unlocked state when the flexible extension 160A is positioned outside of the retaining space 119A. In an embodiment, the locking mechanism 150A enters the unlocked state when the flexible extension 160A is positioned outside both the through-hole 118A and the retaining space 119A.

In an embodiment, the non-alignment of the flexible extension 160A with the through-hole 118A in the second direction $D_2$ is caused by the width W of the locking mechanism 150A. As shown in FIG. 7, the locking mechanism 150A has a width W defined by the flexible extension 160A. In an embodiment, the flexible extension 160A is configured to be flexed by the external force $F_1$ such that the width W of the locking mechanism 150A is changed (e.g., reduced). For example, the locking mechanism has a width $W_1$ when the external force $F_1$ flexes the flexible extension 160A. In an embodiment, the external force $F_1$ may compress the flexible extension 160A to reduce the width W of the locking mechanism 150A. The flexible extension 160A is configured to be compressed without being permanently deformed.

As shown in FIG. 6B, the through-hole 118A has a width $W_2$ and the retaining space 119A has a width $W_3$. The width $W_3$ of the retaining space 119A is greater than the width $W_2$ of the through-hole 118A. When the locking mechanism 150A is moved from the unlocked position (as shown by the locking mechanism 150B in FIG. 8B) to the locked position (as shown by the locking mechanism 150A in FIG. 8C), the flexible extension 160A moves from the through-hole 118A into the retaining space 119A. The larger width $W_3$ of the retaining space 119A (relative to the width $W_2$ of the through-hole 118A) allows the flexible extension 160A to at least partially un-flex in the retaining space 119A. This un-flexing of the flexible extension 160A causes the width W of the locking mechanism 150A (e.g., along the flexible extension 160A) to be larger than the width $W_2$ of the through-hole 118A. Thus, the normal width W of the locking mechanism 150A in the locked state (i.e., when not being acted on by the external force $F_1$) is greater than the width $W_2$ of the through-hole 118A. When the external force $F_1$ flexes the flexible extension 160A, the width $W_1$ of the locking mechanism 150A is equal to or smaller than the width $W_2$ of the through-hole 118A. Accordingly, the locking mechanism 150A moves from the unlocked state to the locked state by flexing the flexible extension 160A to reduce the width W of the locking mechanism 150A and then moving the locking mechanism 150A in the second direction $D_2$.

Accordingly, when disposed in the retaining space 119A, the geometry of the flexible extension 160A maintains the locking mechanism 150A in the locked state. For example, when the locking mechanism 150A is moved from the unlocked state to the locked state by moving in the first direction $D_1$, the geometry of the flexible extension 160A in the retaining space 119A then prevents the locking mechanism 150A from being moved in the opposite direction $D_2$. In an embodiment, the geometry of the flexible extension 160A that maintains the locking mechanism 150A in the locked state is the width W of the locking mechanism 150A as described above.

The flexible extension 160A may be flexed to move the locking mechanism 150A from the unlocked state to the locked state. In an embodiment, one or both of the through-hole 118A and the flexible extension 160A may configured so that the force that moves the locking mechanism 150A in the first direction $D_1$ also flexes the flexible extension 160A to fit through the through-hole 118A. For example, when in the unlocked state, one or more of the surface(s) of the through-hole 118A and the surface(s) of the flexible extension 160A that face each other when the locking mechanism 150A is in the unlocked position may be sloped.

The upper surface 158A of the locking mechanism 150A is generally flat relative to the insertable member 130A. However, the locking mechanism 150A, in an embodiment, may have a concave upper surface 158A and a length L that positions the contact surface 156A external to the aperture 32A when the flexible extension 160A is disposed in the retaining space 119A. The convex shape of the upper surface 158A allows for a sufficient flexion of the insertable member 130A to move the tab 132A from its engaged state to the unengaged state. In such an embodiment, the locking mechanism 150A may be moved from its locked state to the unlocked state by moving in the direction $D_2$ opposite of the first direction $D_1$. The locking mechanism 150A is in the unlocked state when the flexible extension 160A is disposed in the retaining space 119A, and is in the locked state when the flexible extension 160A is disposed external to the retaining space 119A. In such an embodiment, the flexible extension 160A may be configured to inhibit movement of the locking mechanism 150A in the direction $D_1$ when in the locked state as similarly discussed above except with respect to movement in direction $D_2$. For example, the flexible extension 160A in such an embodiment is prevented from being inserted into the through-hole 118A in the same manner as discussed above, except with respect to direction $D_1$ instead of direction $D_2$.

As shown in FIGS. 4 and 8C, when the handle 100A is pulled in the detachment direction $D_2$, the tab 132A in the engaged state is configured to contact the front outer surface 38A of the protrusion 30A to prevent removal of the insertable member 130A from the aperture 32A. However, in an embodiment, a notch (not shown) may be provided within the aperture 32A, and the tab 132A may be configured to prevent removal of the insertable member 130A by engaging with said notch. For example, the notch may be provided in the inner surface 38A of the protrusion 30A or the outer surface 22 of the wafer carrier 1. In such an embodiment, the insertable member 130A may only partially extend through the aperture 32A. In such an embodiment, a portion of the locking mechanism 150A when in its locked state may be disposed between the protrusion 30A and insertable member 130A. In an embodiment, the tab 132A may extend from the insertable member 130A in a different direction than away from the outer surface 22 of the wafer carrier 1 (e.g., different from direction $D_3$ in FIG. 8C). For example, the tab 132A in an embodiment may extend from the insertable member 130A towards the outer surface 22 (e.g., in direction $D_4$, etc.) of the wafer carrier 1 or in a direction perpendicular to the direction away from the outer surface 22 of the wafer carrier 1 (e.g., in direction $D_5$ in FIG. 9, etc.)

As discussed above, the insertable member 130A is configured to automatically flex the tab 132A into the engaged state when inserted through aperture 32A. However, in an embodiment, the insertable member 130A may not be configured to flex the tab 132A into the engaged state. In an embodiment, the locking mechanism 150A may flex the insertable member 130A to flex the tab 132A into the engaged position. For example, the tab 132A may be on the front surface 134A of the insertable member 130A and the insertable member may need to be flexed in the second direction $D_2$ to flex the tab 132A into the engaged state. The locking mechanism 150A when moved into the locked state may be configured to push the insertable member 130A in the second direction $D_2$ to flex the tab 132A into the engaged state.

Figure 9:
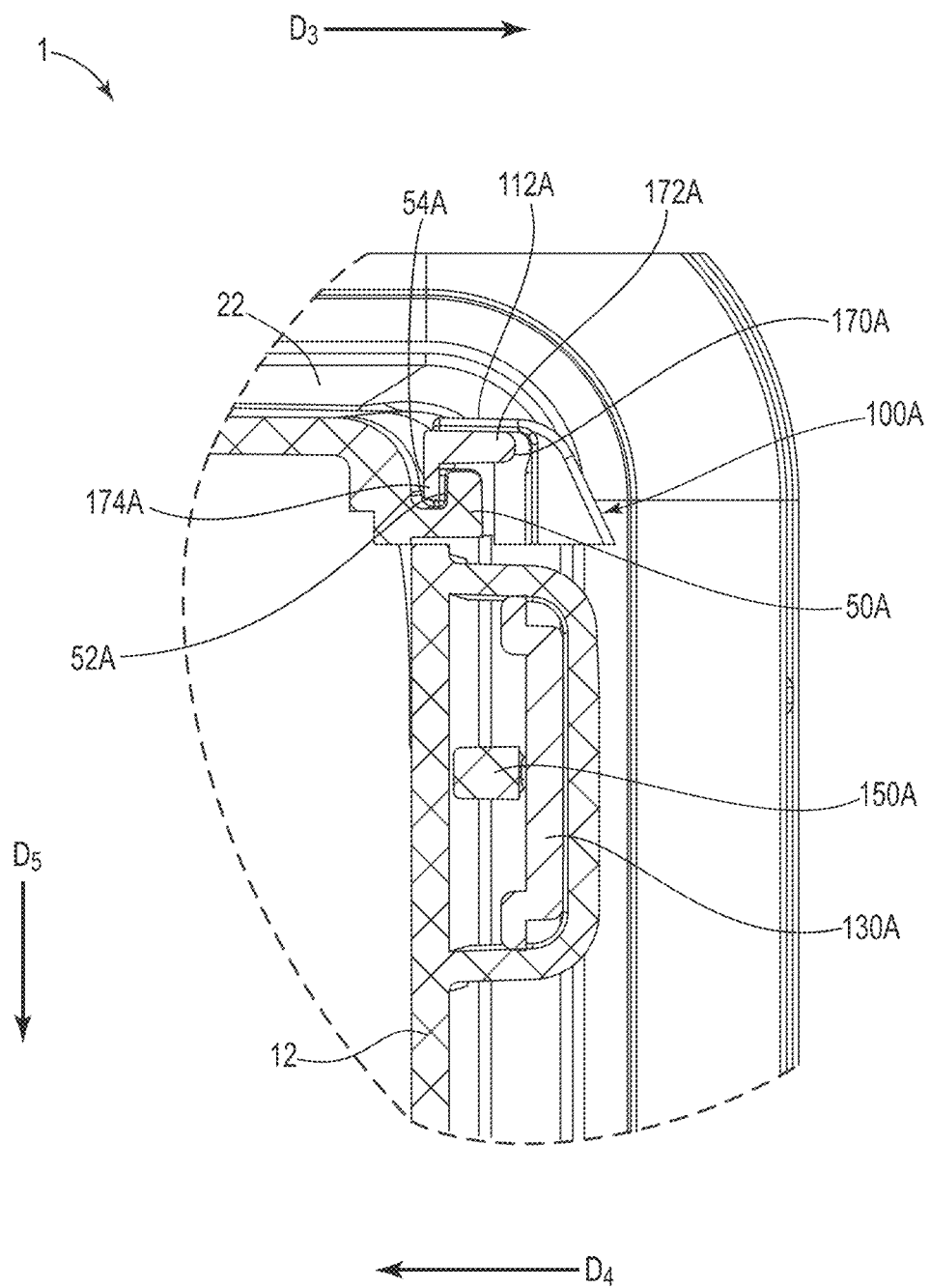
FIG. 9 is a sectional view of a portion of the wafer carrier shown in FIG. 4 along the line IX-IX.

FIG. 9 is a sectional view of a portion of the wafer carrier 1 along the line IX-IX in FIG. 4. The first projection 170A of the handle 100A is engaged with the first rail 50A of the wafer carrier 1. More specifically, the first projection 170A is configured to interlock with the first rail 50A.

The projection 170A includes a first portion 172A and a second portion 174A that is directly connected to the first portion 172A. The first portion 172A extends away from the body 110A of the handle 100A in a first direction $D_4$, and the second portion 174A extends away from the first portion 172A in a different direction $D_5$. The direction $D_4$ of the first portion 172A is not planar with the first end 112A of the body 110A. In an embodiment, the first rail 50A extends away from the outer surface 22 of the side 12 of the wafer carrier 1. The first rail 50A includes an inner surface 52A and a slot 54A. The slot 54A is defined by the inner surface 52A. The projection 170A extends into the slot 54A of the rail 50A. Contact between the inner surface 52A and the rail 50A and the second portion 174A of the projection 170A is configured to prevent movement of the attached handle 100A away from the outer surface 22 of the wafer carrier 1 (e.g., movement in direction $D_3$). The second rail 60A and second projection 180A have a similar structure and engagement as described for the first rail 50A and the first projection 180A, except being rotated as the projection rail 180A is disposed along the second end 114A of the handle 100A.

As shown in FIG. 3, the wafer teeth 20 are attached to the sides 12, 14 of the wafer carrier 1. A force pulling on the handle 100A (e.g., in direction $D_3$) can cause the side 12 to outwardly deflect, which can affect the form of the wafer teeth 20 and damage the wafers in the wafer teeth 20. For example, the rails 50A, 60A and projections 170A, 180A provide more rigid contact points (e.g., at or near the corners) for attaching the handle 100A to outer surface 22 of the wafer carrier 1. The more rigid contact points can help mitigate outward deflections of the side 12 by distributing pulling forces from the handle 100A to the corners of the wafer carrier 1.

The slot 54A defined by the first rail 50A faces upward in FIG. 9 (i.e., in direction $D_5$). However, in an embodiment, directions of the first rail 50A and the second portion 174A may be revered. For example, in such an embodiment, the slot 54A may face downward (i.e., opposite the direction $D_5$). In an embodiment, the second rail 60A and the second projection 180A may also be modified in such a manner.

The handle 100A of the wafer carrier 1 has two insertable members 130A, 140A, two rails 170A, 180A, and one locking mechanism 150A. However, the handle 100A in an embodiment may have a different number of insertable members 130A, 140A, rails 170A, 180A, and locking mechanisms 150A. In an embodiment, the handle 100A may include one or more of insertable members 130A, 140A. In an embodiment, the handle 100A may include one or more rails 170A, 180A. In such embodiments, the wafer carrier 1 may include a corresponding number of protrusions 30A, 40B and rails 50A, 60A. In an embodiment, the wafer carrier 1 may include multiple of the locking mechanisms 150A for the handle 100A. For example, the wafer carrier 1 in an embodiment may have each of the insertable members 130A, 140A of the handle 100A provided with a respective locking mechanism.

The handles 100A, 100B and locking mechanisms 150A, 150B shown in FIGS. 1-9 and described above are for a wafer carrier 1. However, it should be appreciated that the handles 100A, 100B, locking mechanisms 150A, 150B, and protrusions 30A, 30B may be similarly applied to other types of wafer carrier such as, but not limited to, a front opening shipping box (FOSB) in a similar manner as shown and described for the wafer carrier 1. In an embodiment, a front opening shipping box (FOSB) may include at least a protrusion 30A, 30B, a handle 100A, 100B, and a locking mechanism 150A, 150B for the handle 100A, 30B.

Figure 10:
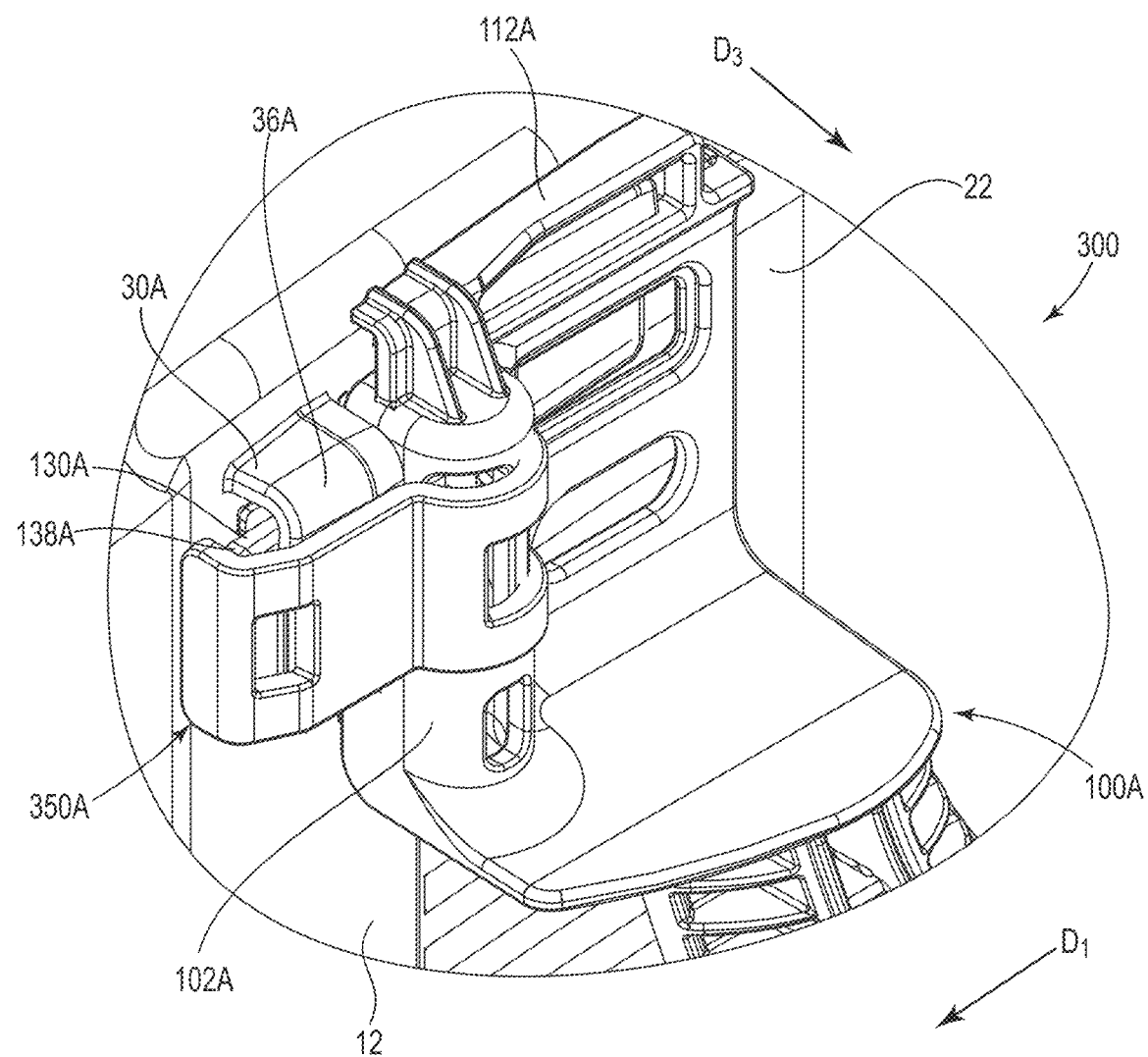
FIG. 10 is a perspective view of a portion of a wafer carrier according to an embodiment of the disclosure.
Figure 11:
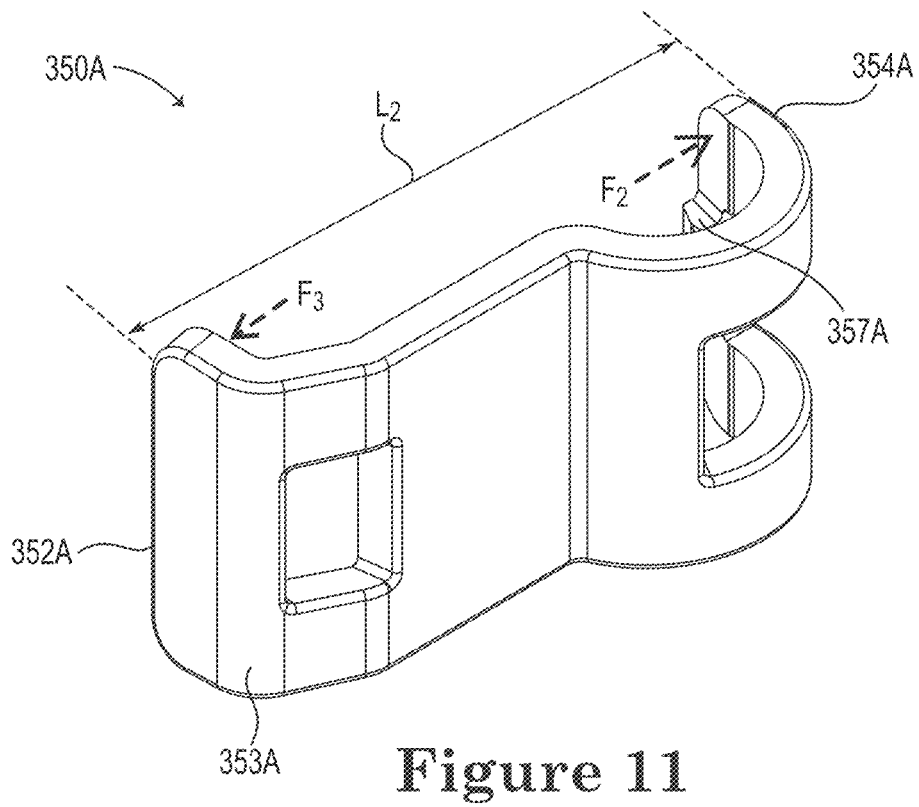
FIG. 11 is a front perspective view of a locking mechanism of the wafer carrier shown in FIG. 10.
Figure 12:
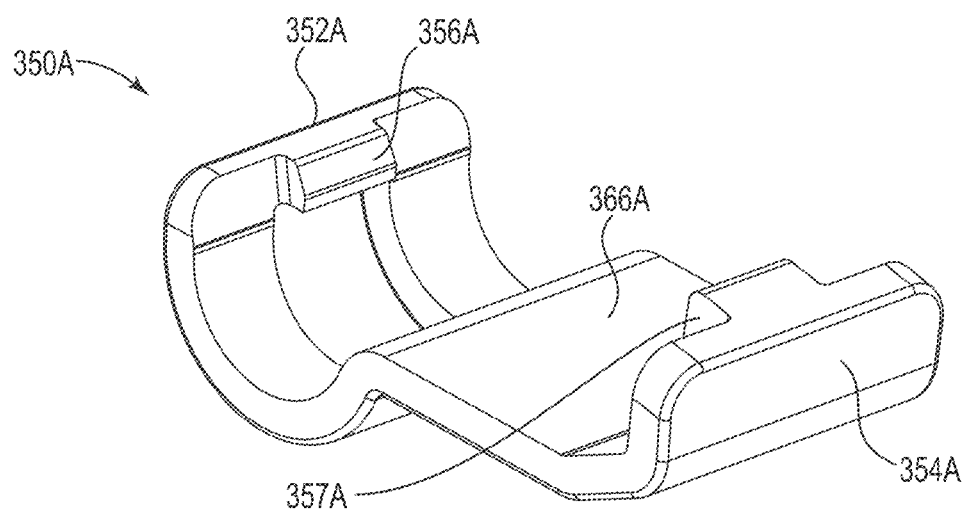
FIG. 12 is a side perspective view of the locking mechanism of the wafer carrier shown in FIG. 10.

FIGS. 10-12 illustrate a locking mechanism 350A according to another embodiment. FIG. 10 is a perspective view of a portion of a FOUP 300. FIG. 11 is a front perspective view of the locking mechanism 350A. FIG. 12 is a rear perspective view of the locking mechanism 350A.

The FOUP 300 includes the handles 100A, 100B similar to the wafer carrier 1 in FIGS. 1-5. Accordingly, the FOUP 300 also includes a second locking mechanism similar to the locking mechanism 350A for the second handle 100B of the wafer carrier 1.

FIG. 10 shows the locking mechanism 350A in the locked position. The locking mechanism 350A is separate from the handle 100A and wafer carrier 1 when in the unlocked position, and is moved to the locked position by coupling the locking mechanism to the handle 350A. The locking mechanism 350A has a locked state and an unlocked state. The locking mechanism 350A moves from the unlocked state to the locked state by being coupled to the handle 100A. When in the locked state, the locking mechanism 350A maintains the tab 138A of the insertable member 130A in its engaged state. The tab 132A is not labeled in FIG. 10 as it is obscured by the locking mechanism 350A in the view of FIG. 10. More specifically, the locking mechanism 350A in its locked state is configured to prevent movement of the tab 138A that would remove the tab 138A from its engaged state. The locking mechanism 350A moves from the locked state to the unlocked state by being uncoupled from the handle 350A.

As shown in FIGS. 11 and 12, the locking mechanism 350A has a front end 352A, a rear end 354A, an inner surface 366A, and a length $L_2$. The locking mechanism 350A has a generally concave shape. The locking mechanism 350A includes a first tab 356A disposed at the front end 352A and a second tab 357A disposed at the rear end 354A. The first tab 356A and the second tab 357A have a similar structure. The first tab 356A and the second tab 357A each extend from the inner surface 366A of the locking mechanism 350A. In an embodiment, the first tab 356A and the second tab 357A each extend from the inner surface 366A in a direction parallel to the length $L_2$ of the locking mechanism 350A. The locking mechanism 350A is coupled to the handle 100A with the first tab 356A and the second tab 357A.

When the locking mechanism 350A is in its locked state, the first tab 356A contacts the back side 136A (shown in FIG. 6C) of the insertable member 130A and the second tab 357A is inserted into the through-hole 118A of the handle 100A. For example, when in the locked state, the first tab 356A is hooked on the end 138A of the insertable member 130A and the second tab 357A is hooked in the through-hole 118A. In an embodiment, the through-hole 118A for the tab 357A may instead be a blind hole. When coupled to the handle 100A, the first tab 356A presses against the back side 136A of the insertable member 130A. This pressure on the insertable member 130A by the locking mechanism 350A in the locked state prevents the insertable member 130A from flexing towards the outer surface 22 of the wafer carrier 1, and prevents movement of the tab 132A from the engaged state. Thus, the locking mechanism 350A maintains the engaged state of the tab 132A.

The locking mechanism 350A extends a length larger than its normal length $L_2$ (i.e., the length when no external force $F_2$, $F_3$ is applied to the locking mechanism 350A). The length for coupling to and coupling from the handle 100A is larger than the length $L_2$. The locking mechanism 350A is configured to be flexible such that an external force (e.g., force $F_2$, force $F_3$) can increase the length $L_2$ of the locking mechanism 350A. In an embodiment, a portion of the locking mechanism 350A at the first end 352A is a flexible extension 353A. When no external force $F_2$, $F_3$ is applied to the locking mechanism 350A, the extendable extension 353A keeps its geometry and maintains the length $L_2$. The position of the extendable portion 353A keeping the locking mechanism 350A coupled to the handle 100A. Accordingly, geometry of the extendable portion 353A maintains the locking mechanism 350A in its locked state.

When the locking mechanism 350A is in its locked state it can be moved to its unlocked state (i.e. decoupled) by applying an external force (e.g., force $F_2$, force $F_3$) to the inner surface 366A of the locking mechanism 350A along the first end 352A or the second end 354A. For example, the external force $F_2$, $F_3$ causes the extendable extension 353A to extend and increases the length $L_2$ of the locking mechanism 350A. The larger length $L_2$ decouples the locking mechanism 350A from the handle 100A.

The illustrated embodiment of the locking mechanism 350A in FIGS. 10-12 is separate from the handle 100A when in the unlocked state (i.e., decoupled from the handle 100A in the unlocked state). However, in an embodiment, the handle 100A and the locking mechanism 350A may be a single integral piece. In such an embodiment, the rear end 354A may be integrally connected with the body 110A of the handle 100A. The front end 353A is flexible relative to the insertable member 130A such that the front end 353A is configured to be pulled away from the insertable member 130A in direction $D_3$ to allow the protrusion 30A to fit between the front end 353A and the insertable member 130A to detach the handle 100A from the wafer carrier 1.

The locking mechanism 350A is shown in FIGS. 10-12 and described above as being for a FOUP 300. However, it should be appreciated that the handle 100A, the locking mechanism 350A, and the protrusion 30A may be similarly applied to other types of wafer carriers such as, but not limited to, a front opening shipping box (FOSB). In an embodiment, a wafer carrier may include a handle 100A, a protrusion 30A, and a locking mechanism 350A for the handle 100A in a similar manner as shown and described for the FOUP 300. In an embodiment, the wafer carrier may include a pair of the protrusions 30A, 30B, a pair of the handles 100A, 100B, and a pair of the locking mechanisms 350A.

Figure 13:
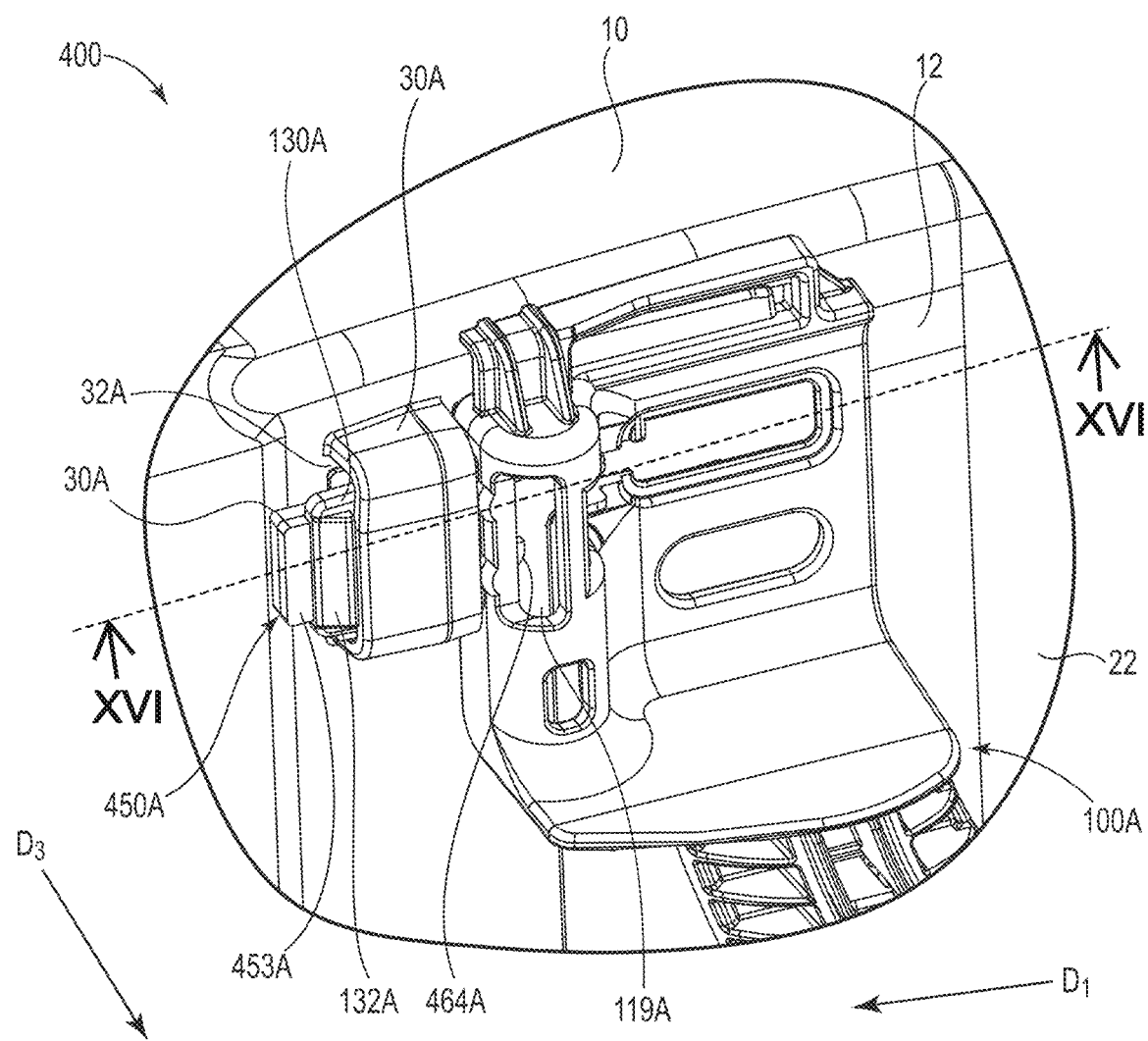
FIG. 13 is a perspective view of a portion of a wafer carrier according to an embodiment of the disclosure.
Figure 14:
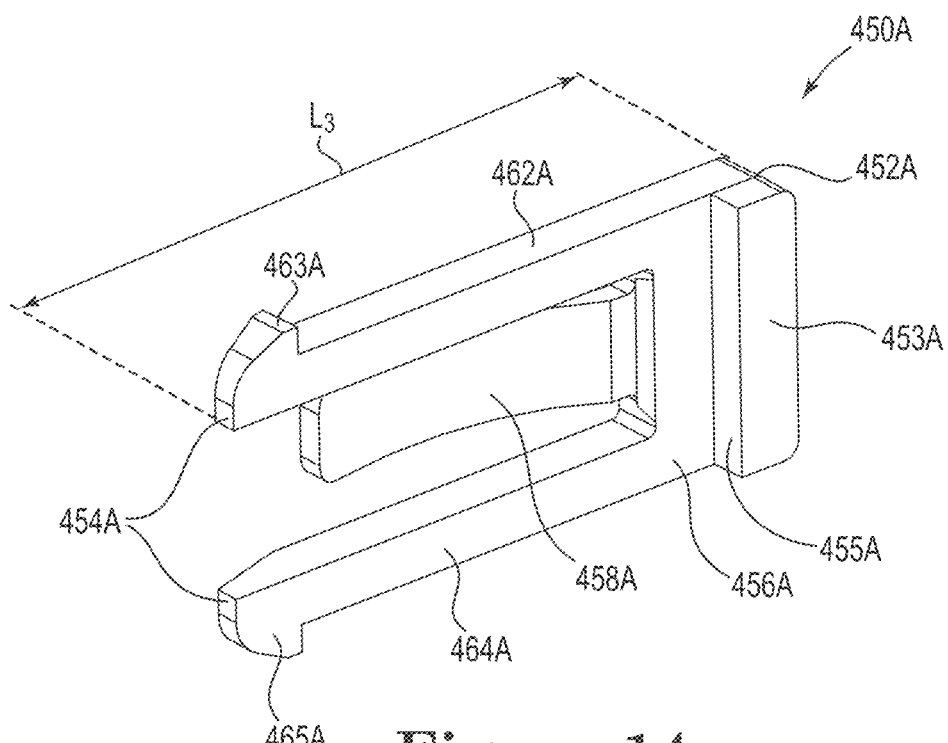
FIG. 14 is a front perspective view of the locking mechanism of the wafer carrier shown in FIG. 13.
Figure 15:
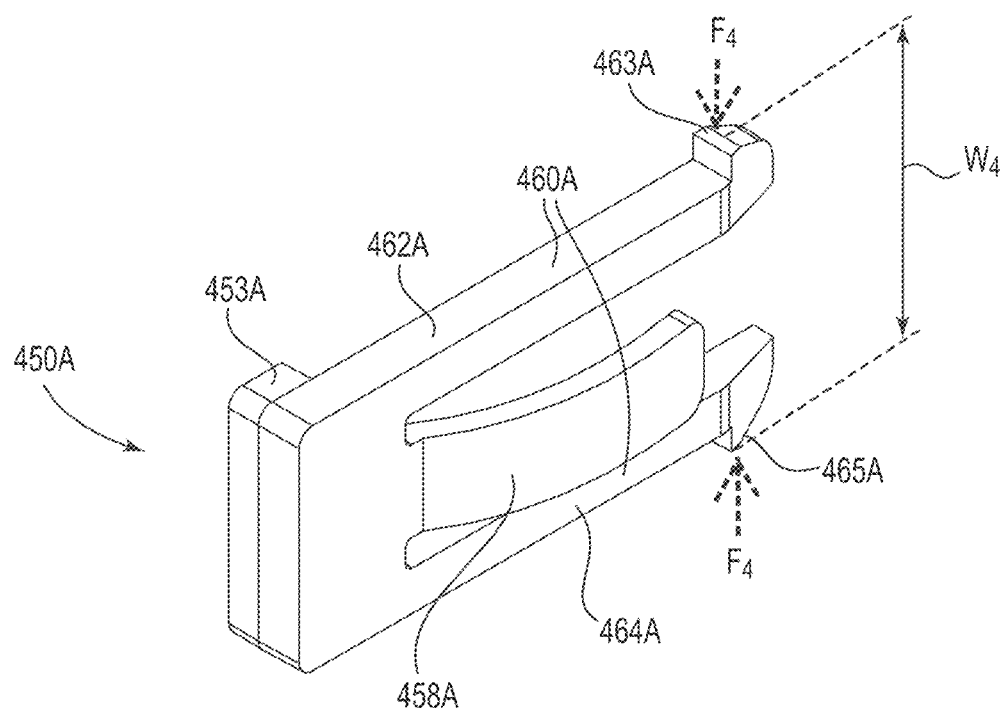
FIG. 15 is a rear perspective view of the locking mechanism of the wafer carrier shown in FIG. 13.
Figure 16:
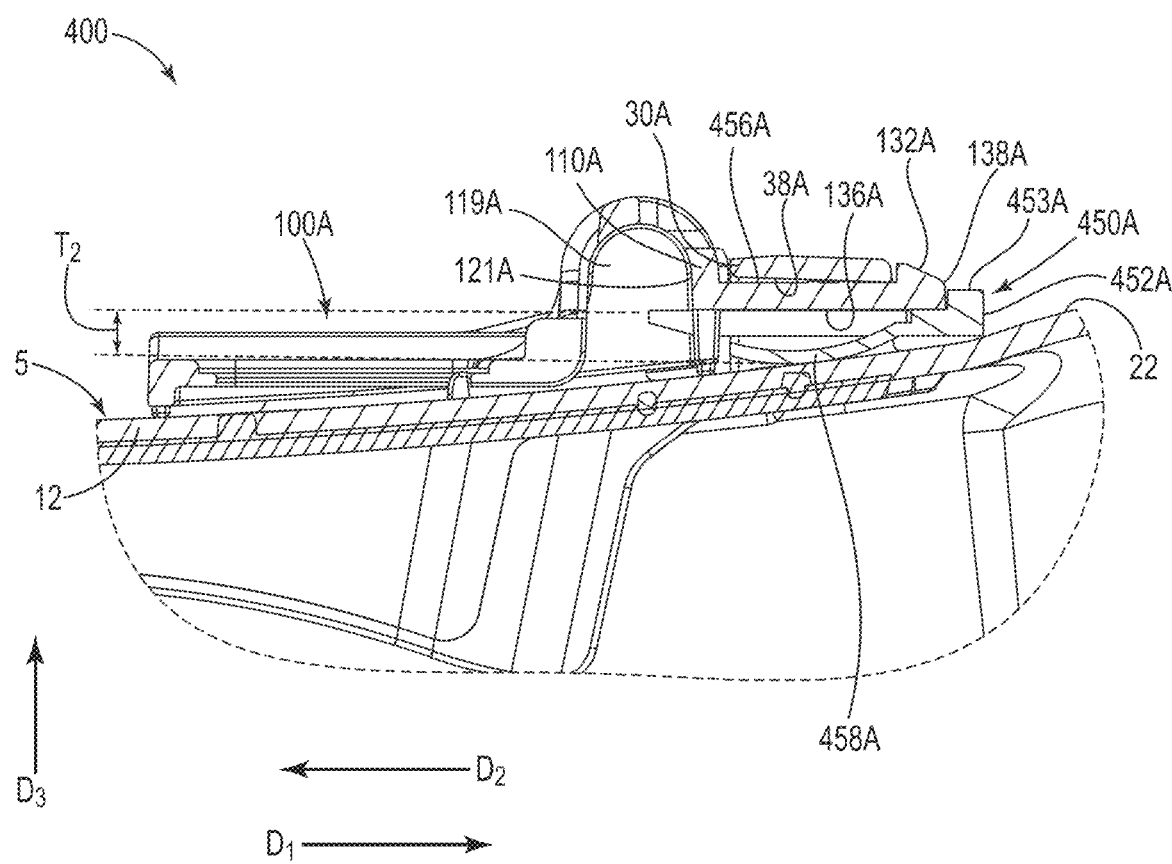
FIG. 16 is a sectional view of a portion of the wafer carrier shown in FIG. 13 along the line XVI-XVI.

FIGS. 13-16 illustrate a locking mechanism 450A according to another embodiment. FIG. 13 is a perspective view of a portion of a FOUP 400. FIG. 14 is a front perspective view of the locking mechanism 450A. FIG. 15 is a rear perspective view of the locking mechanism 450A. FIG. 16 is a partial sectional view of the FOUP 400 along the line XVI-XVI in FIG. 13.

The FOUP 400 includes the detachable handles 100A, 100B similar to the wafer carrier 1 in FIGS. 1-4. Accordingly, the FOUP 400 includes a second locking mechanism similar to the locking mechanism 450A for the second handle 100B of the wafer carrier 1.

The locking mechanism 450A has a locked state and an unlocked state. FIGS. 13 and 16 show the locking mechanism 450A in the locked state. The locking mechanism 450A moves from the unlocked state to the locked state by being inserted into the aperture 32A in a direction $D_2$ opposite to the insertion direction $D_1$ of the insertable member 130A into the aperture 32A. The locking mechanism 450A is moved from the locked state to the unlocked state by moving in the direction $D_1$.

As shown in FIGS. 14-16, the locking mechanism 450A includes a front end 452A, a rear end 454A, a length $L_3$, a lip 453A, a biasing member 458A, and a flexible extension 460A. The flexible extension 460A includes a first arm 462A with a first tab 463A and a second arm 464A with a second tab 465A. In an embodiment, the length $L_3$ of the locking mechanism 450A extends parallel to the direction in which the insertable member 130A extends from the body 110A of the handle 100A. The length $L_3$ of the locking mechanism 450A is perpendicular to its thickness $T_2$.

When the locking mechanism 450A is in its locked state, the biasing member 458A contacts the outer surface 22 of the wafer carrier 1 and pushes a contact surface 456A into contact with the back side 136A of the insertable member 130A. The insertable member 130A is pinched between the contact surface 456A of the locking mechanism 450A and the inner surface 38A of the protrusion 30A. The biasing member 464A configured to provide the locking member 450A with a thickness $T_2$ that prevents the flexing of the insertable member 130A. The biasing member 464A configured to provide the locking member 450A with a thickness $T_2$ that prevents the flexing of the insertable member 130A. In an embodiment, the biasing member 464A is configured to provide the locking mechanism 450A with a thickness $T_2$ that at least prevents the insertable member from flexing to the least amount that allows the tab 132A to be moved from its engaged position. This prevents the insertable member 130A from flexing the tab 134A from its engaged state. Thus, the locking mechanism 450A in its locked state maintains the engaged state of the tab 134A.

The lip 453A is located at the front 452A of the locking mechanism 450A. The lip 453A is configured to limit how far the locking mechanism 450A can be inserted into the aperture 32A. The lip extends above the contact surface 453A. When the locking mechanism 450A is moved into the locked state, the lip 453A contacts the end 138A of the insertable member 130A and prevents further the insertion of the locking mechanism 450A. For example, the lip 453A may prevent the locking mechanism 450A from being fully inserted into or through the aperture 30A.

The tabs 463A, 465A contact an inner surface 121A of the handle 100A when in the locked position and no external force $F_4$ is applied to the arms 462A, 464A. More specifically, the tabs 463A, 465A are hooked on one or more inner surface(s) 121A of the handle 100A. For example, the retaining space 119A may define the inner surface 121A of the handle 100A. The contact of the tabs 463A, 465A on the inner surface(s) prevents the locking mechanism 450A from moving in the first direction $D_1$. The flexible extension 460A is configured for an external force $F_4$ to flex the arms 462A, 464A closer together which reduces the width $W_4$ and moves the arms 462A, 464A away from their corresponding inner surface(s) 121. For example, the external force $F_4$ may be applied by a person that wants to move the locking mechanism 450A to the unlocked position.

Accordingly, the size and positioning of the arms 462A, 464A of the flexible extension 460A maintains the locking mechanism in its locked position. For example, the width $W_4$ of the flexible extension 460A along tabs 463A, 465A prevents movement of the locking mechanism 450A from its locked state.

As shown in FIG. 16, the contact surface 456A is configured to push against the insertable member 130A in the direction $D_3$. However, as discussed above, the insertable tab 132A in an embodiment be configured to extend from the insertable member 130A in a direction different than away from the outer surface 22 of the wafer carrier 1 (e.g., different than direction $D_3$). In such an embodiment, the locking mechanism 450A may be configured to push against the insertable member 130A in the appropriate direction so that the tab 132A of the insertable member 130A is maintained in its engaged state. For example, the locking mechanism 450A may extend between the projection 30A and the front side 134A of the insertable member 130A and be configured to push the insertable member 130A towards the outer surface 22 of the wafer carrier 1 or be configured to push the insertable member 130A in a direction perpendicular to the direction $D_1$ and the direction $D_3$.

The locking mechanism 450A is shown in FIGS. 13-16 and described above as being for a FOUP 400. However, it should be appreciated that the handle 100A, the locking mechanism 450A, and the protrusion 30A may be similarly applied to other types of wafer carriers such as, but not limited to, a front opening shipping box (FOSB).

FIGS. 17-21 show various embodiments of a wafer carrier 500 and handle 510 in accordance with another embodiment of the disclosure.

Figure 17:
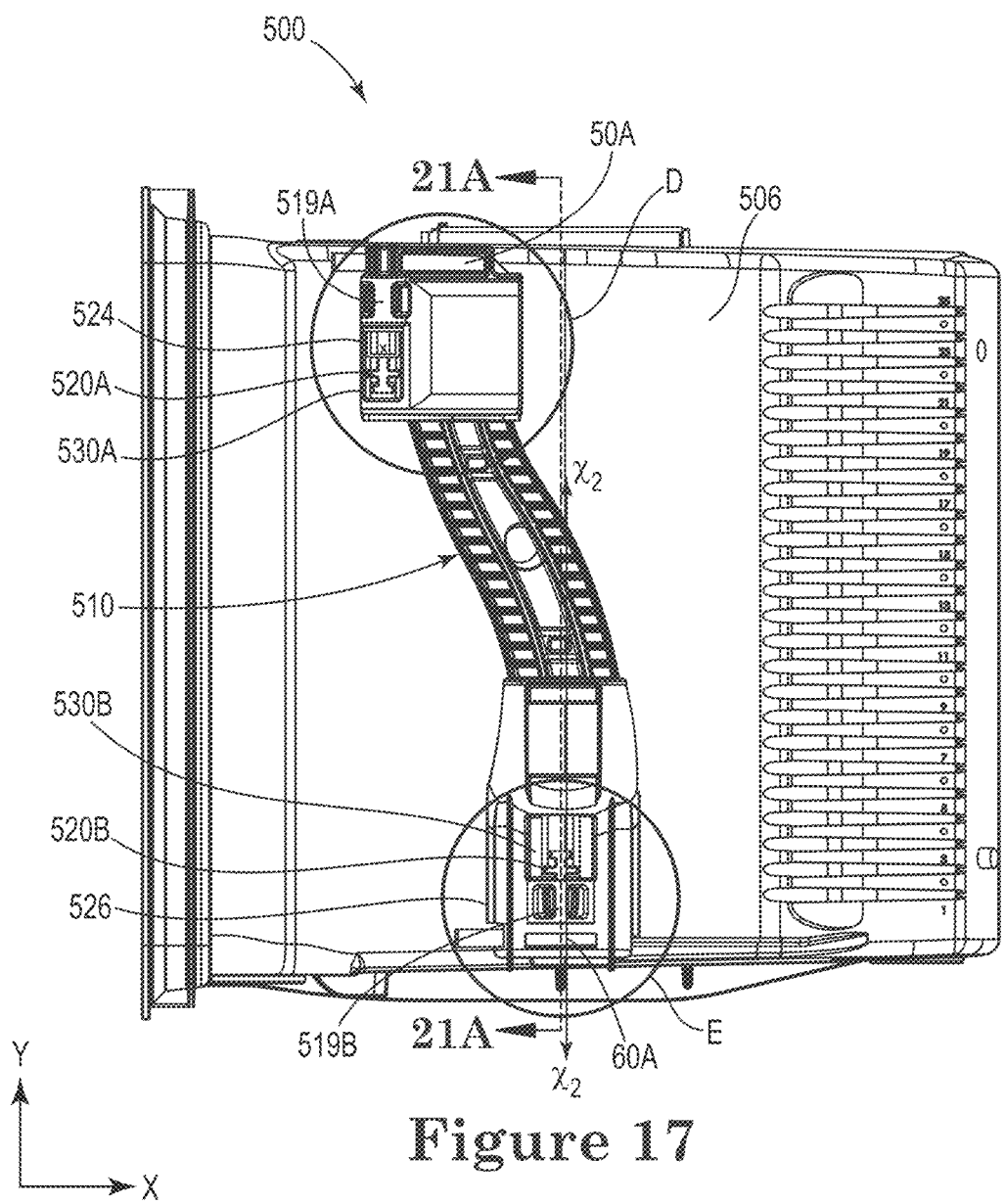
FIG. 17 is a side view of a wafer including a handle and a locking mechanism in accordance with an embodiment of the disclosure.

FIG. 17 is a side view of a wafer carrier 500 including handle 510 and locking mechanisms 520A, 520B in accordance with another embodiment of the disclosure. The wafer carrier 500 can be a FOUP or a FOSB, as described herein and can have many of the same features as wafer carrier 1 described herein. In one embodiment, wafer carrier 500 is a FOUP. Handle 510 includes many of the same features as handle 100A, discussed above, with reference in particularly to FIGS. 6A-6C. It will be appreciated by those of skill in the art that the wafer carrier 500 includes a second handle having the same features as handle 510 on the opposite side wall of the wafer carrier 500 which is not shown here for the sake of brevity.

As shown in FIG. 17, handle 510 is engaged with rails 50A, 60A provided on the side wall 506 of the wafer carrier 504. Rails 50A, 60A are previously described herein with such as, for example, rails 50A, 60A, best viewed in FIG. 5. The handle 510 includes a handle body 512 and a first locking mechanism 520A provided at an upper end 524 of the handle body 512 and a second locking mechanism 520B provided at a lower end 526 of the handle body 512. Each of the locking mechanisms 520A, 520B are configured to be retained within vertical guide 530A, 530B provided at each of the upper end 524 and the lower end 526 of the handle body 512 such that they are able to slide within vertical guides 530A, 530 to transition from an unlocked state to a locked state. Locking mechanisms 520A, 520B can be retained in the locked state by retaining space 519A, 519B. In FIG. 17, locking mechanism 520A is depicted in an unlocked state and locking mechanism 520B is depicted in the locked state.

Figures 18A, 18B, 18C:
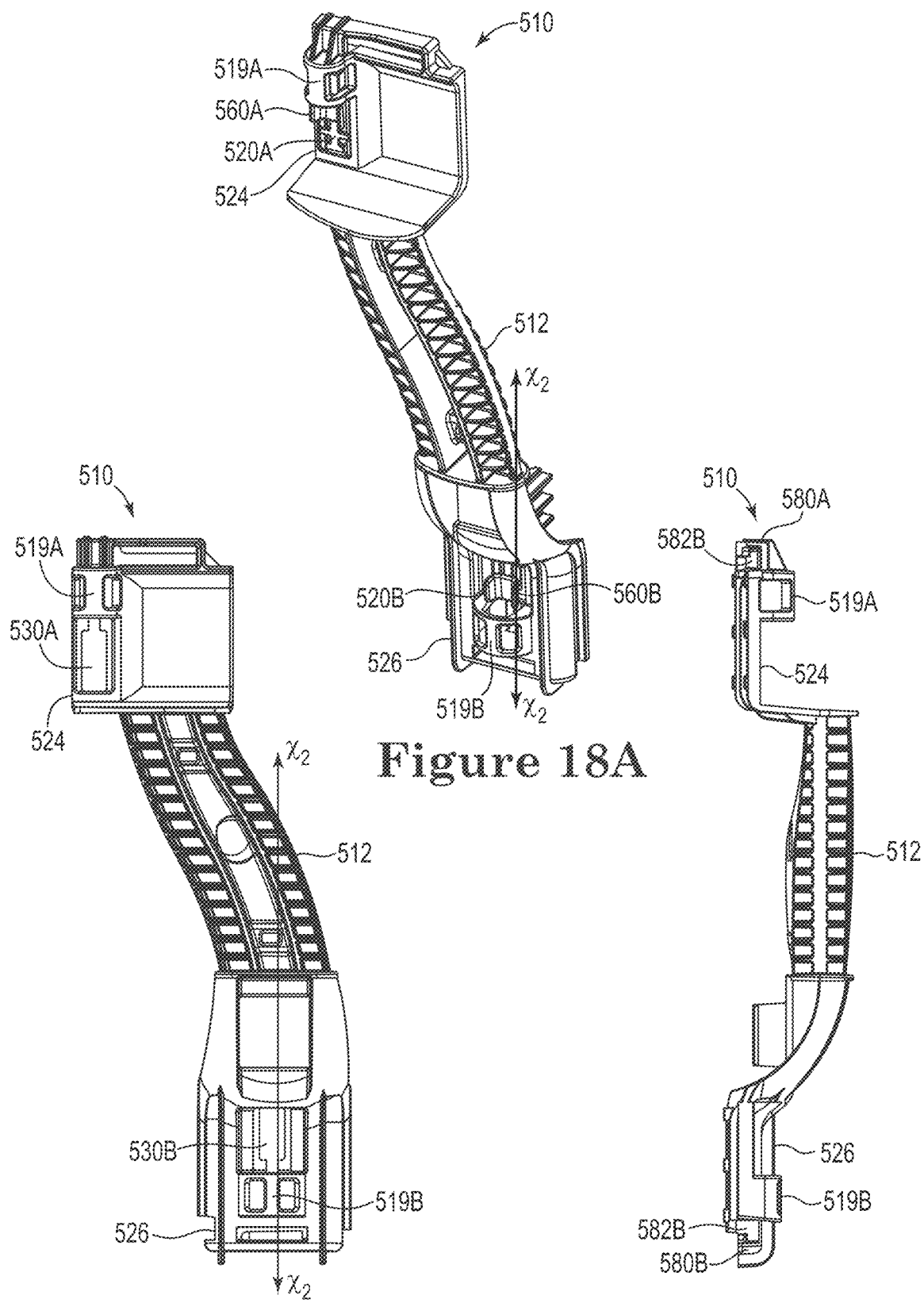
FIG. 18A is a perspective view of the handle shown in FIG. 17.
FIG. 18B is a front view of the handle shown in FIG. 17.
FIG. 18C is a side view of the handle shown in FIG. 17.

FIGS. 18A-18C show different views of the handle 510. FIG. 18A shows handle 510 including locking mechanisms 520A, 520B each in the unlocked state. FIG. 18B is a front view of handle 510 with locking mechanism 520A, 520B removed such that vertical guides 530A, 530B in which locking mechanisms 520A, 520B are retained and transition from the unlocked state to the locked state are visible. FIG. 18C is a side view of handle 510. Like handle 100A, described herein, handle 510 includes upper protrusion 580A and lower protrusion 580B that are configured to engage and slide along rails 50A, 60A. Upper and lower protrusions 580A, 580B have a shape that is complementary to the shape of rails 50A, 60A. In some embodiments, upper and lower protrusions 580A, 580B have a downwardly extending L shape defining a guide 582A, 582B which facilitates upper and lower protrusions 580A, 580B to be retained on and slide along rails 50A, 60A.

Figure 19:
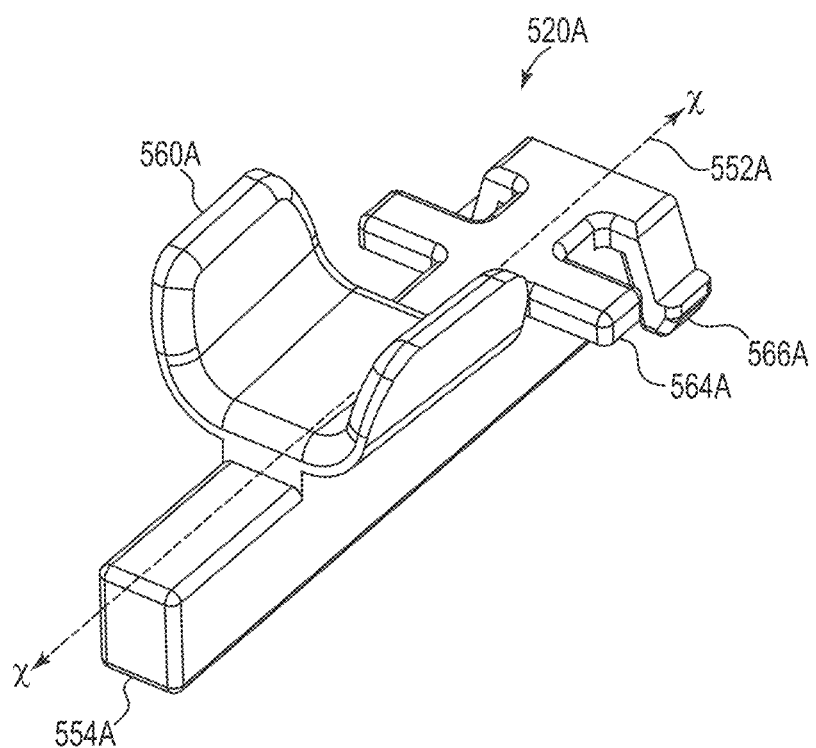
FIG. 19 is a perspective view of the locking mechanism shown in FIG. 17 that interacts with the handle.
Figure 20A:
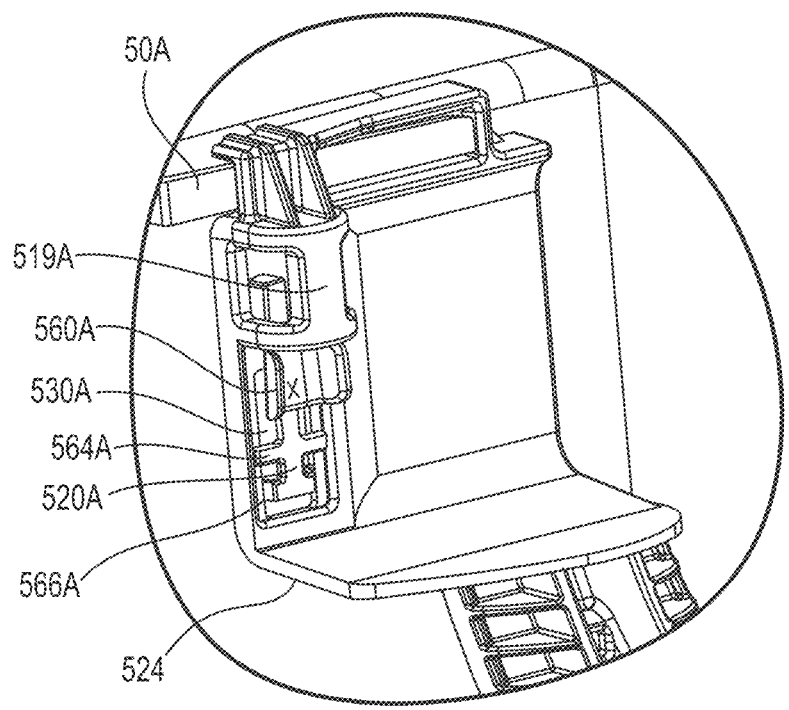
FIG. 20A is an enlarged view of the area D shown in FIG. 17.
Figure 20B:
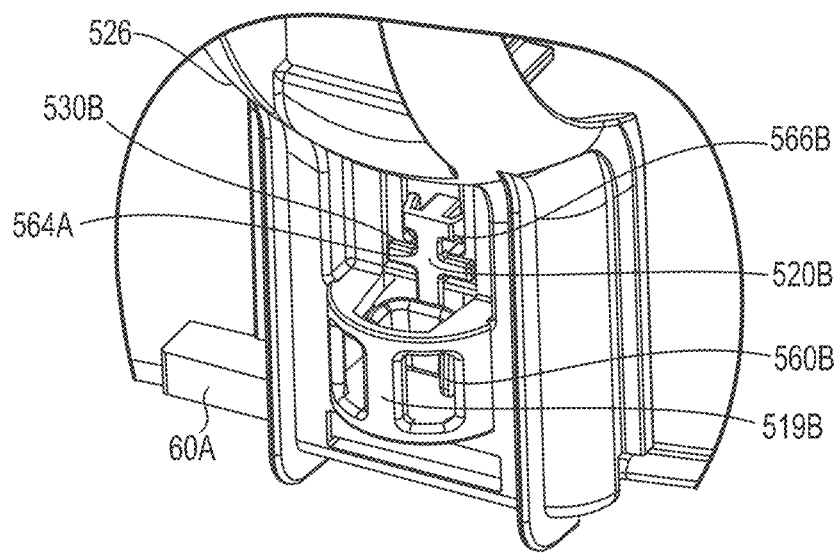
FIG. 20B is an enlarged view of the area E shown in FIG. 17.
Figure 21:
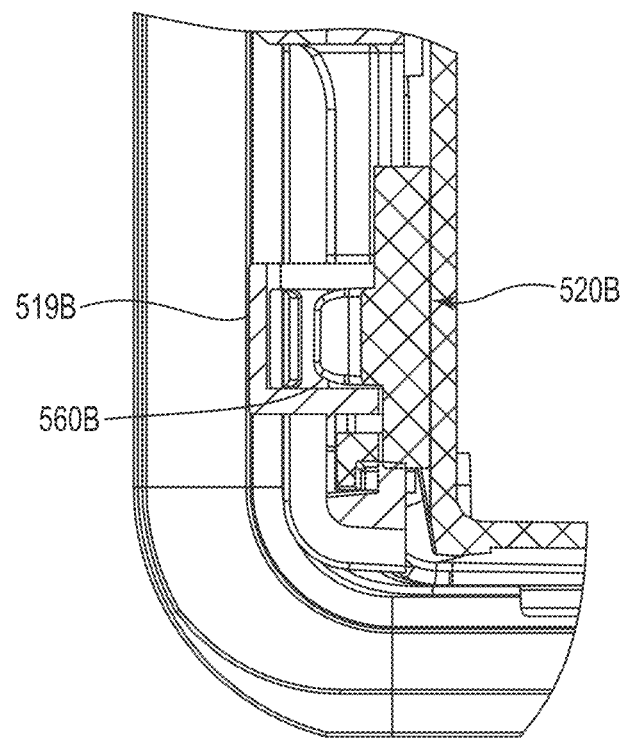
FIG. 21 is a cross-sectional view of the wafer carrier shown in FIG. 17 taken along the line 21A-21A.

FIG. 19 shows locking mechanism 520A in isolation. FIGS. 20A and 20B show close up views of first locking mechanism 520A provided at an upper end 524 of the handle body 512 and second locking mechanism 520B provided at a lower end 526 of the handle body 512, respectively. FIG. 21 is a cross sectional view showing locking mechanism 520B in a locked state.

Locking mechanisms 520A, 520B are configured to prevent unintended detachment of the handle 510 from the wafer carrier 500. Locking mechanisms 520A, 520B are configured to be retained in vertical guides 530A, 530B (best viewed in FIG. 18B) so as to be able to slide within vertical guides 530A, 530B when transitioning from an unlocked state to a locked state. FIG. 20A shows locking mechanism 520A in an unlocked state. FIG. 20B shows locking mechanism 520B in a locked state.

Referring now to FIG. 19, locking mechanism 520A includes a first end 552A and a second end 554A and a flexible extension 560A located between the first end 552A and second end 554A. Locking mechanism 520 includes upper restriction 564A and lower restriction 566A provided at a first end 552A. In an embodiment, one upper restriction 564A and one lower restriction 566A may be provided along each side of the locking mechanism 520A. In an embodiment, one of the restrictions 566A is bendable (e.g., bendable in a direction of the width W) to allow the locking mechanism 530A to be formed separately from the handle 510 and then snapped into the vertical guide 530A. Upper and lower restrictions 564A, 566A are configured to prevent removal of the locking mechanism 520A after being snapped into vertical guide 530A.

As best viewed in FIGS. 20A and 20B, locking mechanisms 520A, 520B are slidably attached to the handle body 512 through interaction of the two restrictions 564A, 564B, and 564A, 566B with vertical guides 530A, 530B. Upper restrictions 564A, 564B are positioned above the upper surface of a wall defining vertical guides 530A, 530B and lower restrictions 566A, 566B is positioned below a lower surface of a wall defining vertical guides 530A, 530B, respectively, such that the walls defining vertical guides 530A, 530B are positioned between upper restrictions 564A, 564B and lower restrictions 566A, 566B of locking mechanism 520A, 520B.

Flexible extension 560A is configured is configured to flex inwardly toward a center liner x from a first state having a first width to a second state having a second width with that is less than the first width in response to an applied force. In the second state, the flexible extension 560A can be received within retaining space 519A when locking mechanism 520A is transitioned to the locked stated.

FIGS. 20B and 21 are different views showing locking mechanism 520B in the locked state. As previously indicated, locking mechanism 520B includes the same features as locking mechanism 520A described herein. As shown in FIGS. 20B and 21, flexible extension 560B is retained within retaining space 519B when locking mechanism 520B is in the locked state. Upon release of the force applied to flexible extension 560B, flexible extension can transition from the second state to the first state causing the flexible extension 560B to be retained in the retaining space 519B. To transition the locking mechanism 520B from the locked state to the unlocked state, the force can be reapplied to the flexible extension 560B so that that the flexible extension 560B is in the second state and has a width that is less than a width of the retaining space 519 allowing for its removal.

Additionally, in some embodiments, second end 554A is sized to be received and retained within a corresponding aperture provided in rail 50A when locking mechanism 520A is in the locked state. Locking mechanism 520B is engaged with rail 60A in the same manner. In some embodiments, rail 60A can be provided with an aperture sized to receive and retain the second end of locking mechanism 520B when locking mechanism 520B is in the locked state.

FIGS. 22-26 show various views of a wafer carrier 600 and handle 610 in accordance with another embodiment of the disclosure. Wafer carrier 600 includes many of the same features as wafer carriers 1 and 500 described herein. Wafer carrier 600 can be a FOUP or a FOSB. In one embodiment, wafer carrier 600 is a FOUP.

Figure 22:
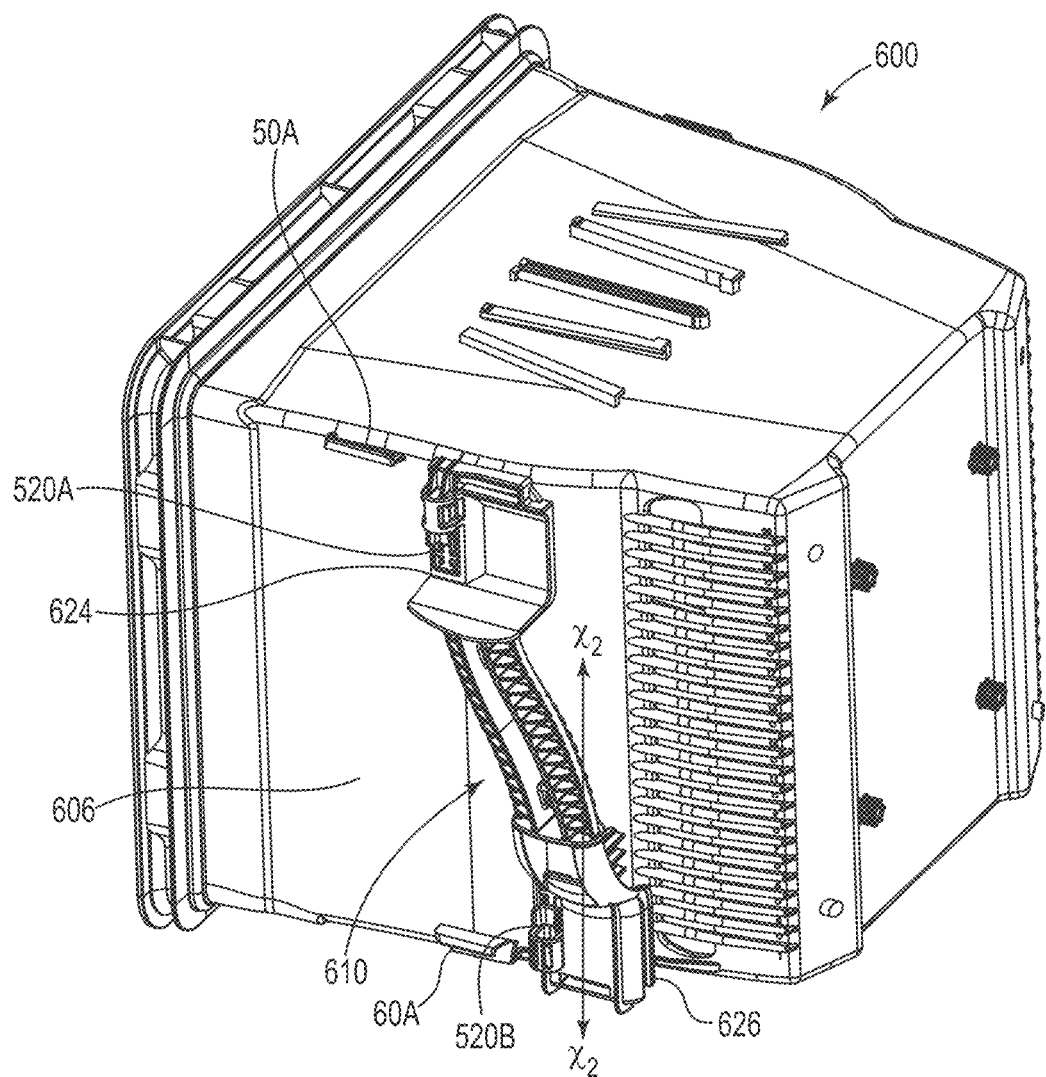
FIG. 22 is a perspective view of a wafer carrier having a handle in a detached state in accordance with an embodiment.
Figure 23:
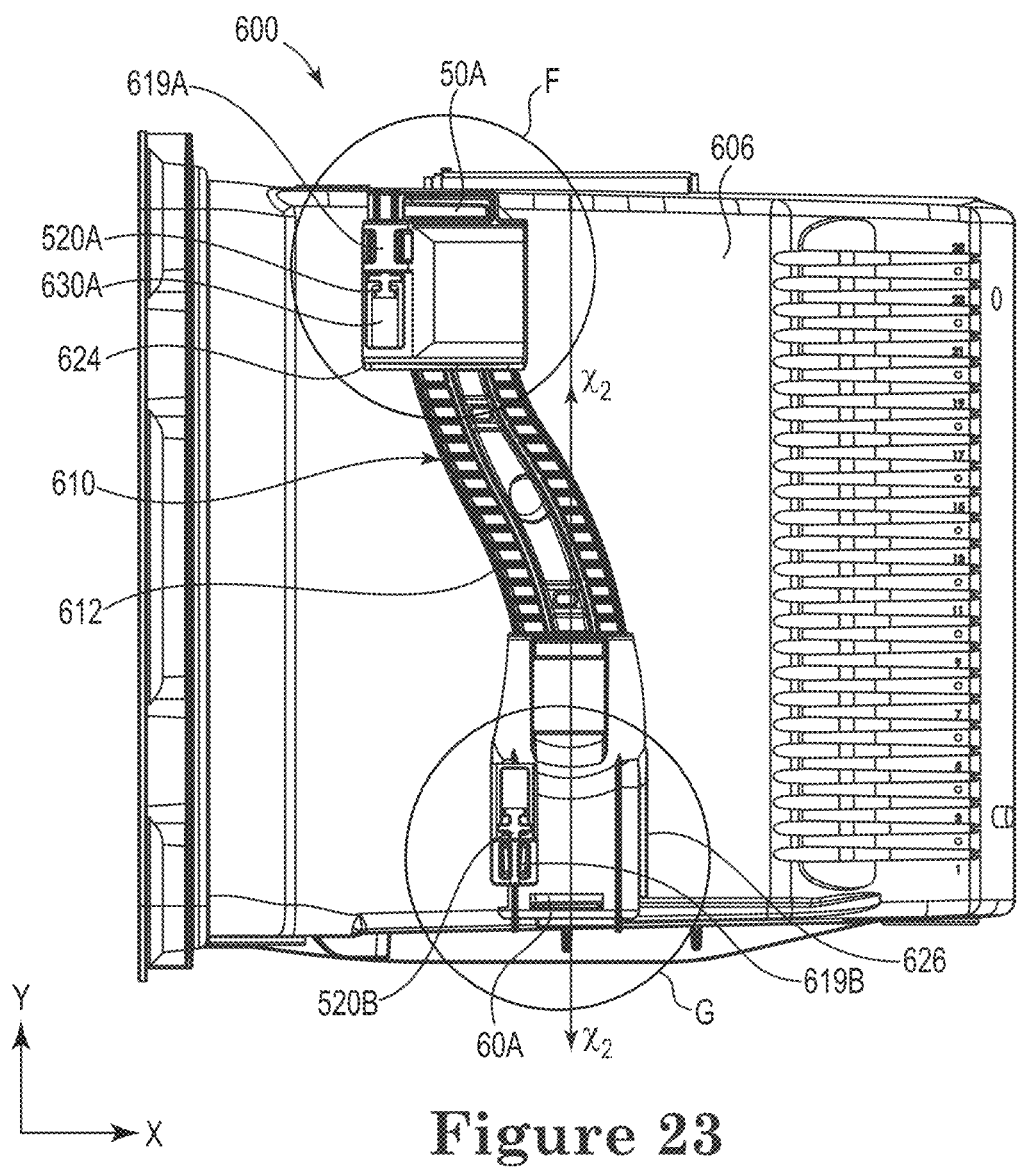
FIG. 23 is a side view of the wafer carrier shown in FIG. 22.

FIG. 22 shows wafer carrier 600 including handle 610 prior to its attachment to rails 50A, 60A provided on the sidewall 606 of the wafer carrier 600. FIG. 23 shows wafer carrier 600 include handle 610 attached to the side wall 606 of the wafer carrier. It will be appreciated by those of skill in the art that the wafer carrier 600 includes a second handle having the same features as handle 610 on the opposite side wall of the wafer carrier 600 which is not shown here for the sake of brevity.

As shown in FIG. 23, handle 510 is engaged with rails 50A, 60A provided on the side wall 606 of the wafer carrier 600. Rails 50A, 60A are previously described herein with such as, for example, rails 50A, 60A, best viewed in FIG. 5. The handle 610 includes a handle body 612 and a first locking mechanism 520A provided at an upper end 624 of the handle body 612 and a second locking mechanism 620B provided at a lower end 626 of the handle body 612. Locking mechanisms 520A, 520B are described in detail with reference to FIG. 19. Each of the locking mechanisms 520A, 520B are configured to be retained within vertical guide 630A, 630B provided at each of the upper end 624 and the lower end 626 of the handle body 612 such that they are able to slide within vertical guides 630A, 630 to transition from an unlocked state to a locked state.

In the embodiments shown in FIGS. 22-26, retaining space 619B and vertical groove 630B are offset from a center line $x_2$ extending through the lower end 626 of the handle body 612. In the prior embodiment, described with reference to FIGS. 17-21, retaining space 619B and vertical groove 630B are centered with a center line $x_2$ extending through the lower end 526 of the handle body 512. Rather than cooperating with an aperture provided in rail 60, the second end 554B of the locking mechanism 524B abuts an end of rail 60A, as will be described in greater detail below, when the locking mechanism 524B is in the locked state. In some cases, retaining space 619A and vertical groove 630A located at an upper end 624 of handle 610 also can positioned on the upper end 524 of the handle body such that when the locking mechanism 524A is in the locked state, the second end 554A abuts an end of rail 50A.

Figures 24A, 24B, 24C:
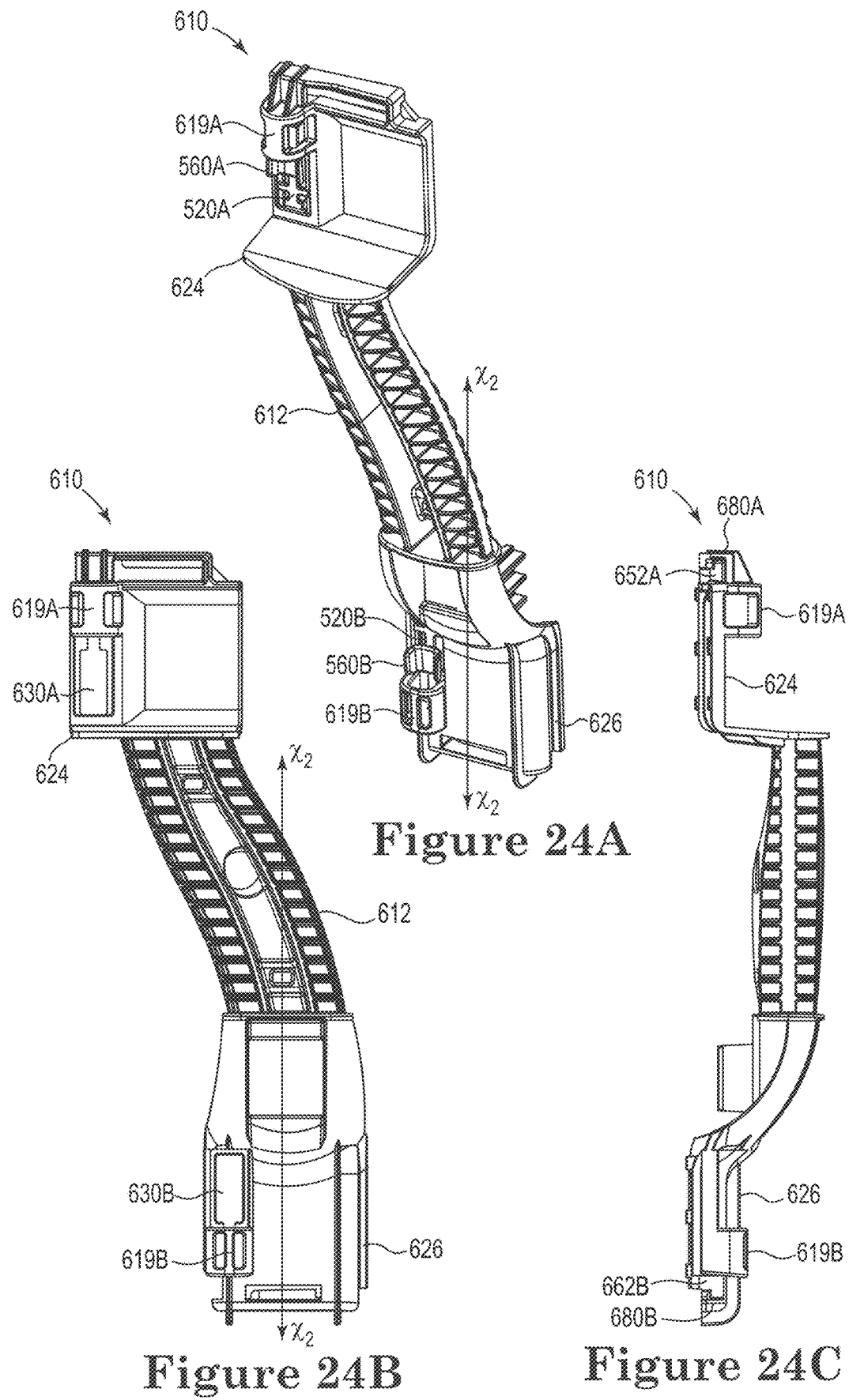
FIG. 24A is a perspective view of the handle shown in FIGS. 22 and 23.
FIG. 24B is a front view of the handle shown in FIGS. 22 and 23.
FIG. 24C is a side view of the handle shown in FIGS. 22 and 23.

FIGS. 24A-24C show different views of the handle 610. FIG. 24A shows handle 610 including locking mechanisms 520A, 520B each in the unlocked state. FIG. 24B is a front view of handle 610 with locking mechanism 520A, 520B removed such that vertical guides 630A, 630B in which locking mechanisms 520A, 520B are retained and transition from the unlocked state to the locked state are visible. FIG. 24C is a side view of handle 610. Like handles 100A and 510, described herein, handle 610 includes upper protrusion 680A and lower protrusion 680B that are configured to engage and slide along rails 50A, 60A. Upper and lower protrusions 680A, 680B have a shape that is complementary to the shape of rails 50A, 60A. In some embodiments, upper and lower protrusions 680A, 680B have a downwardly extending L shape defining a guide 682A, 682B which facilitates upper and lower protrusions 680A, 680B to be retained on and slide along rails 50A, 60A when the handle 610 is secured to the side wall 606 of wafer carrier 600.

Figure 25A:
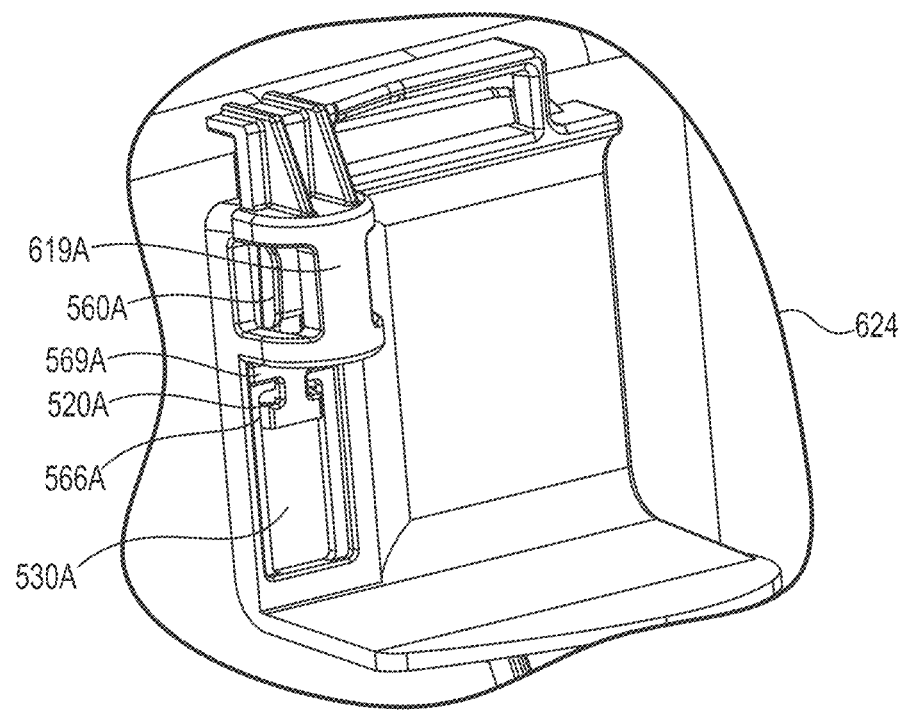
FIG. 25A is an enlarged view of the area F shown in FIG. 23.
Figure 25B:
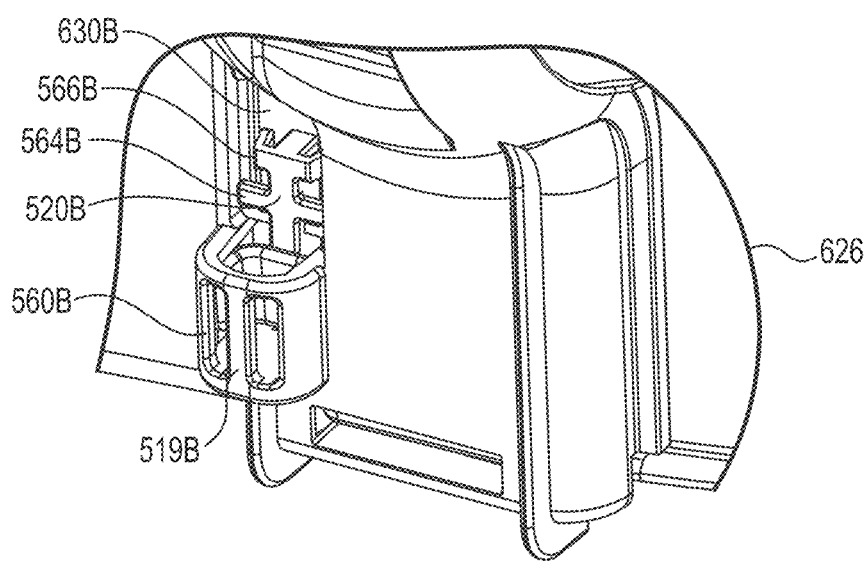
FIG. 25B is an enlarged view of the area G shown in FIG. 23.

FIGS. 25A and 25B are close-up views showing locking mechanisms 520A, 520B in the locked state. Locking mechanisms 520A, 520B can be retained in the locked state by retaining space 619A, 619B. Upon release of the force applied to flexible extensions 560A,560B, flexible extensions 560, 560B can transition from the second state to the first state causing the flexible extensions 560A, 560B to be retained in the retaining spaces 619A, 619B. To transition the locking mechanisms 520A, 520B from the locked state to the unlocked state, the force can be reapplied to the flexible extensions 560A, 560B so that that the flexible extensions 560A, 560B are in the second state and has a width that is less than a width of the retaining spaces 619A, 619B allowing for their removal.

Figure 26:
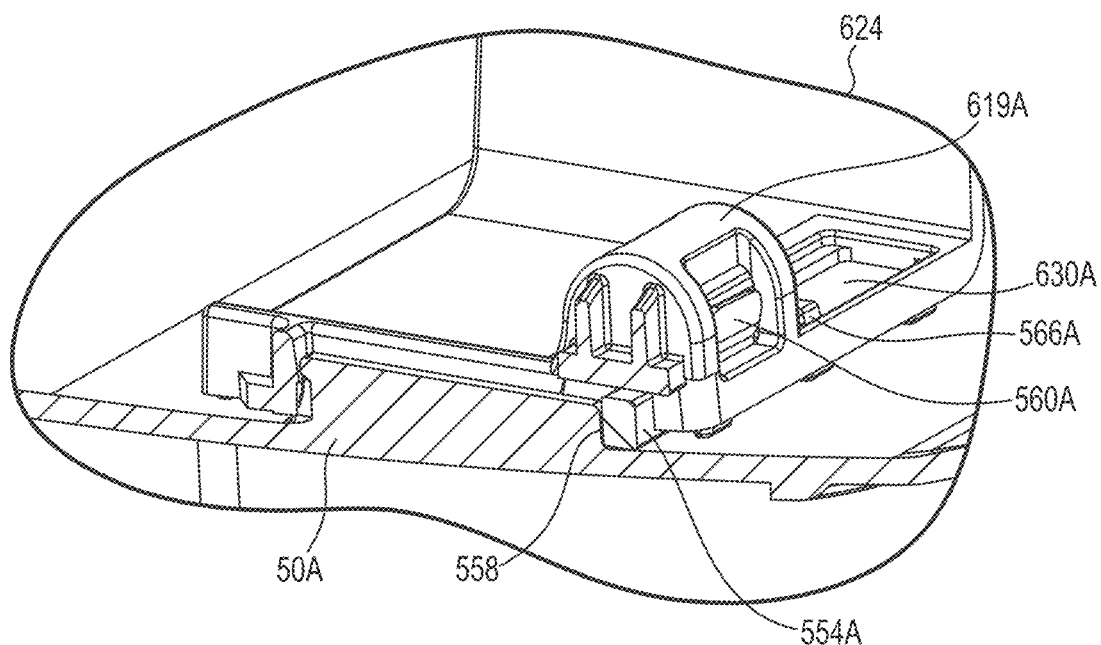
FIG. 26 is a partial cross-sectional view of a locking mechanism engaged with a rail provided on the side wall of the wafer carrier shown in FIGS. 22 and 23 in accordance with an embodiment.

FIG. 26 is a partial cross-sectional view of the upper end 624 of the handle body 612 showing locking mechanism 520A in the locked state and engaged with rail 50A. As can be seen in FIG. 26, flexible extension 560A is received and retained within retaining space 619A and the second end 554A of locking mechanism 520A abuts a distal end 558 of rail 50A. This prevents the handle 610 from being inadvertently being backed off rail 50A.

FIGS. 27-30 show various views of a wafer carrier 700 and handle 710 in accordance with another embodiment of the disclose. Wafer carrier 700 includes many of the same features as wafer carriers 1, 500, and 600 described herein. Wafer carrier 700 can be a FOUP or a FOSB. In one embodiment, wafer carrier 700 is a FOUP.

Figure 27:
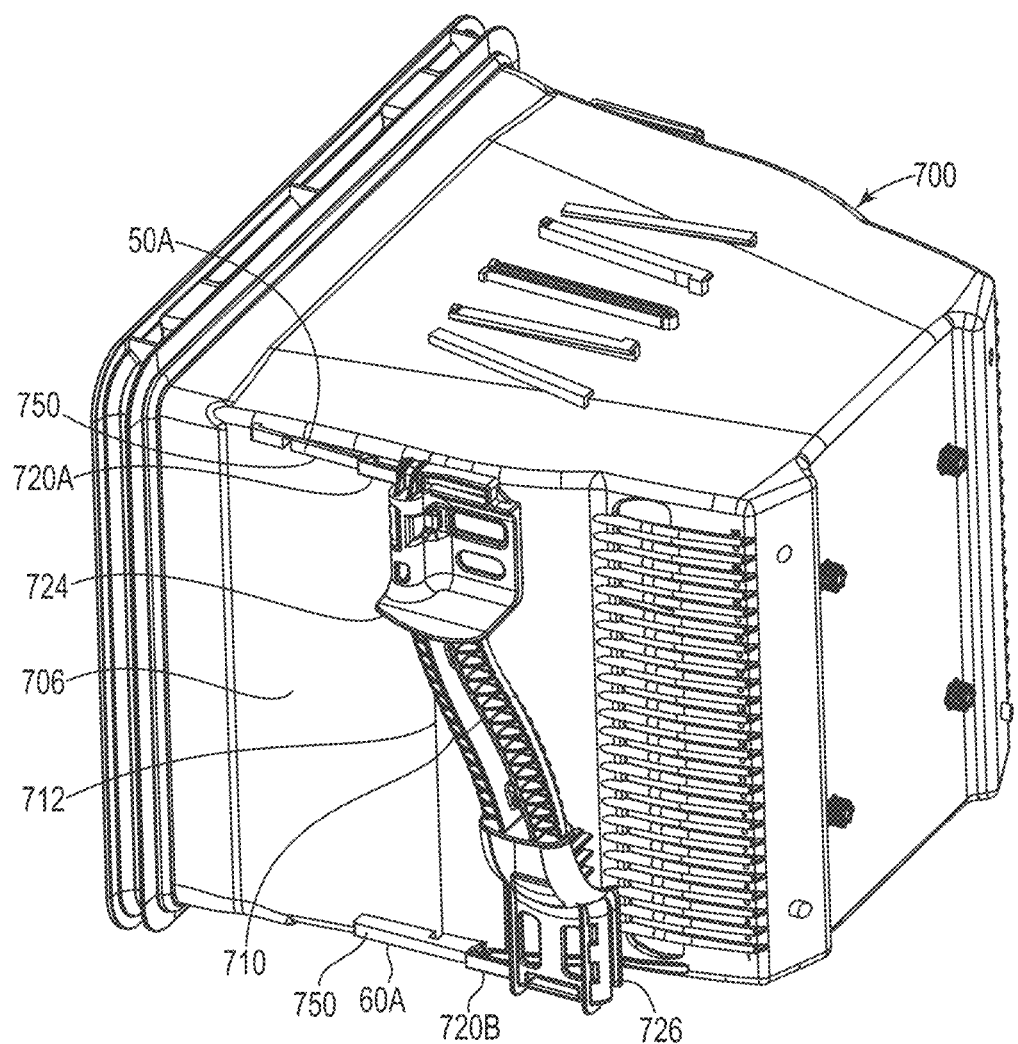
FIG. 27 is a perspective view of a wafer carrier in accordance with another embodiment.
Figure 28:
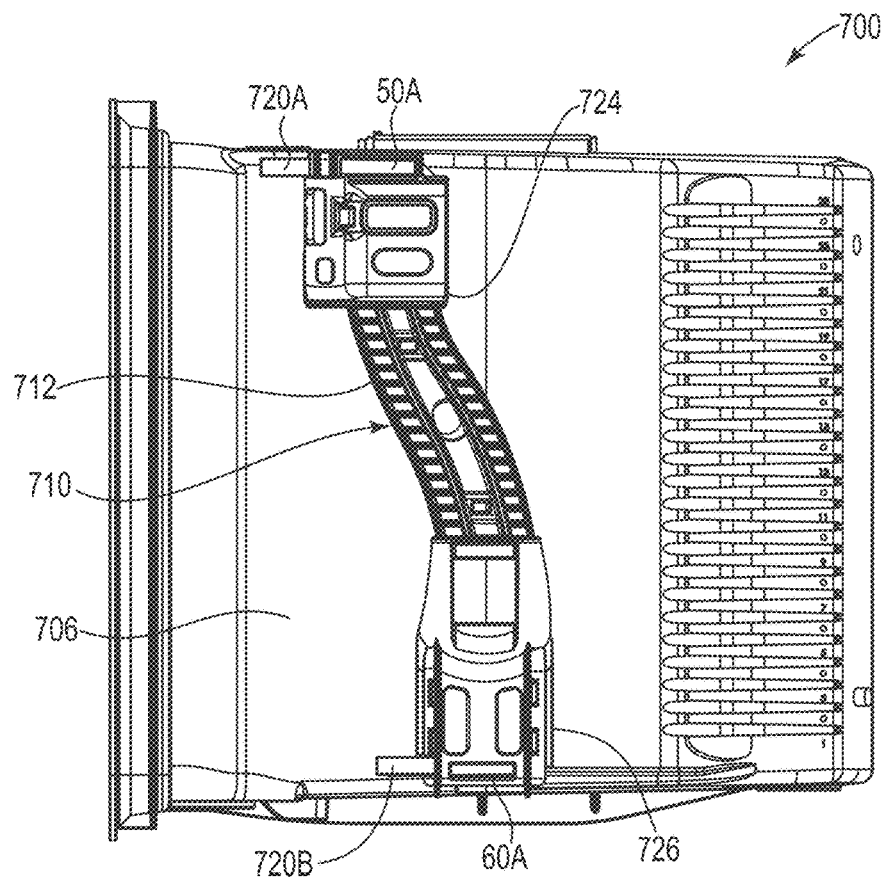
FIG. 28 is a side view of the wafer carrier of FIG. 27.
Figure 30:
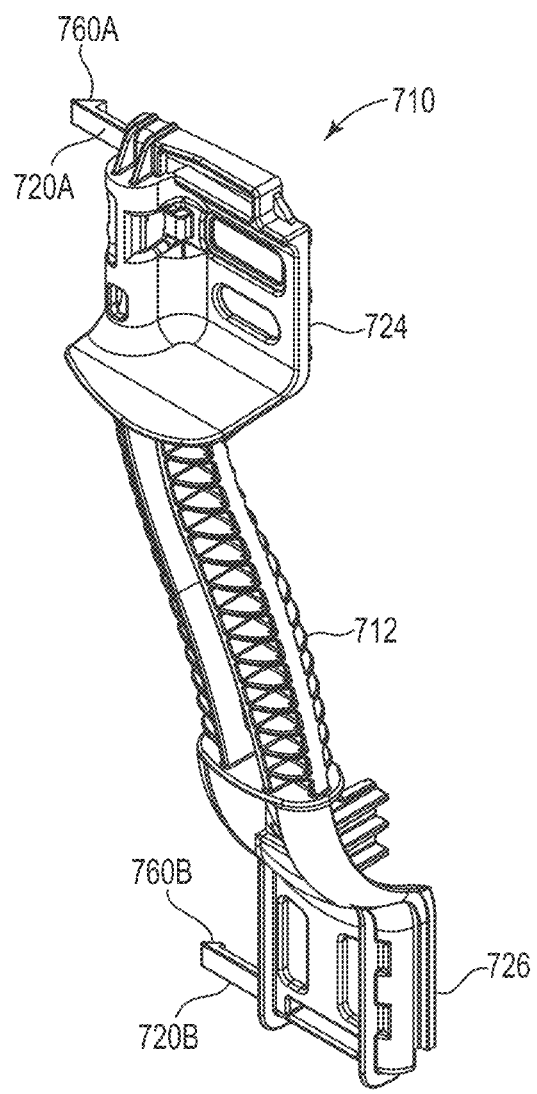
FIG. 30 is a close-up view of the handle attached to the side wall of the wafer carrier shown in FIG. 28.

FIG. 27 shows wafer carrier 700 including handle 710 prior to its engagement with rails 50A, 60A provided on the sidewall 706 of the wafer carrier 700. FIG. 28 shows wafer carrier 700 include handle 710 attached to the side wall 7606 of the wafer carrier 700. FIG. 30 is a view of the handle 710 in isolation. It will be appreciated by those of skill in the art that the wafer carrier 700 includes a second handle having the same features as handle 710 on the opposite side wall of the wafer carrier 700 which is not shown here for the sake of brevity.

Figure 29:
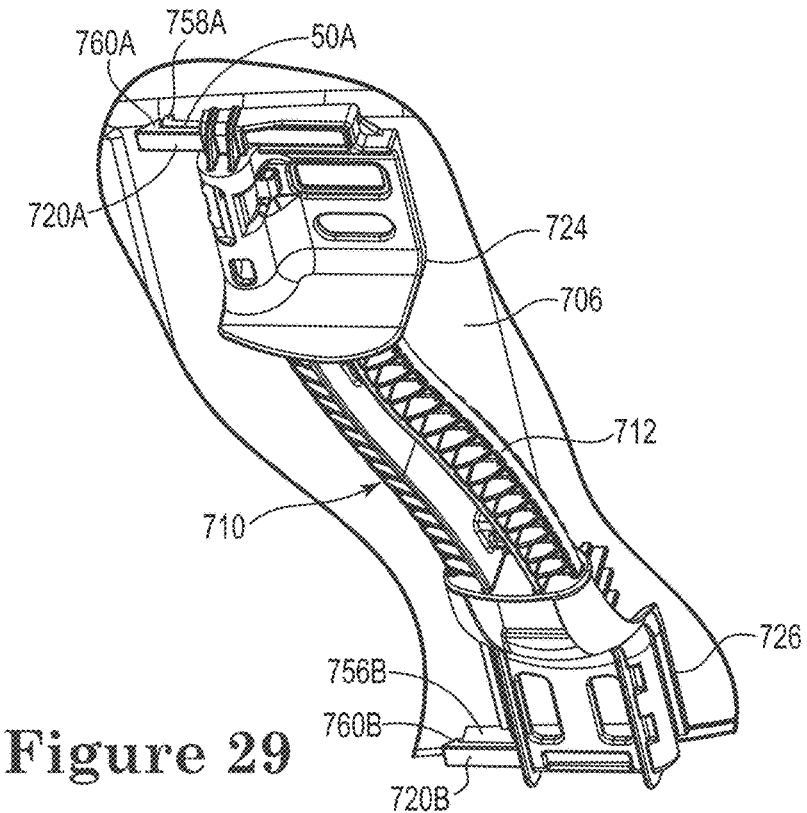
FIG. 29 is a perspective view of the handle shown in FIGS. 27 and 28.

As shown in FIGS. 28 and 29, handle 710 is engaged with rails 50A, 60A provided on the side wall 706 of the wafer carrier 700. Rails 50A, 60A are previously described herein with such as, for example, rails 50A, 60A, best viewed in FIG. 5. The handle 710 includes a handle body 712 and a first locking arm 720A provided at an upper end 724 of the handle body 712 and a second locking arm 720B provided at a lower end 726 of the handle body 712. The distal ends 760A, 760B of each of locking arms 720A, 720 are configured to engage a distal end 758A, 758B of each of rails 50A, 50B. In some embodiments, the distal end 760A, 760B can be configured as a barb, a catch or other protrusion that can engage with the distal ends 758A, 758B of rails 50A, 60A through retention forces (FIGS. 28 and 29).

Each of locking arms 720A, 720B are flexible such that they can be flexed outward and away from the side of the carrier and ride along an outer surface 750 of each of the rails 50A, 60A as the handle 710 is attached to the wafer carrier 700. Upon reaching a distal end 758A, 758B of rails 50A, 50B, each of the flexible arms 720A, 720B are configured to flex back inwardly toward the side wall 706 of the wafer carrier 700 such that a distal end 760A, 760B of each of the flexible arms 720A, 720B is engaged with and retained on a distal end 758A, 758B of each of rails 50A, 50B as best viewed in FIG. 29.

Aspects: Any of aspects 1-13 can be combined with any of aspects 14-23.

Aspect 1. A handle for a wafer carrier, the wafer carrier including a protrusion extending from an outer surface of the wafer carrier, the protrusion defining an aperture between the outer surface of the wafer carrier and an extent of the protrusion for attaching the handle, the handle comprising: a body including: a first end and a second end opposite the first end, and an insertable member disposed between the first end and the second end of the body and configured to be inserted into the aperture to secure the handle to the wafer carrier, the insertable member including a tab that retains the insertable member in the aperture when in an engaged state and a locking mechanism moveable relative to the insertable member between a locked state and an unlocked state, the locking mechanism including a flexible extension, and in the locked state, the locking mechanism maintains the tab in the engaged state and the flexible extension positioned to maintain the locking mechanism in the locked state.

Aspect 2. The handle of aspect 1, wherein the handle is configured to be attached and non-destructively detached from the wafer carrier.

Aspect 3. The handle of either one of aspects 1 or 2, wherein the tab is disposed on a first side of the insertable member, and when in the locked state, the locking mechanism extends along a second side of the insertable member opposite to the first side.

Aspect 4. The handle of any one of aspects 1-3, wherein when in the locked state, a thickness of the locking mechanism maintains the tab in the engaged state.

Aspect 5. The handle of any one of aspect 1-4, wherein when the locking mechanism is in the locked state, a geometry of the flexible extension maintains the locking mechanism in the locked state.

Aspect 6. The handle of any one of aspects 1-5, wherein the flexible extension is configured to be flexible to a smaller geometry or a different position, and to allow movement of the locking mechanism from the locked state in response to an external force flexing the flexible extension to the smaller geometry or the different position.

Aspect 7. The handle of any one of aspects 1-6, wherein the body includes a guide disposed in the body adjacent to the insertable member, the locking mechanism retained by the guide such that the locking mechanism is slidably attached to the body.

Aspect 8. The handle of any one of aspects 1-7, wherein the insertable member is disposed at an end of the grip, at the first end, or between the grip and the first end.

Aspect 9. The handle of any one of aspects 1-8, further comprising: a projection extending from the first end of the body in a first direction and a second direction in that order, the first direction being away from the body and non-planar to the first end of the body, and the second direction different from the first direction, wherein the projection is configured engage a rail of the wafer carrier to secure the handle to the wafer carrier.

Aspect 10. The handle of any one of aspects 1-9, wherein the insertable member is flexible relative to the rest of the body, and the tab movable into the engaged state by the flexing of the insertable member.

Aspect 11. The handle of any one of aspects 1-10, wherein the locking mechanism extends through the body.

Aspect 12. The handle of any one of aspects 1-11, wherein the locking mechanism extends through a through-hole of the body, and when in the locked state, the flexible extension causes a width of the locking mechanism to be larger than a corresponding width of the through-hole.

Aspect 13. The handle of any one of aspects 1-12, wherein the body includes a grip disposed between the first end and the second end of the body.

Aspect 14. A wafer carrier, comprising: an outer surface; a protrusion extending from the outer surface, the protrusion defining an aperture between the outer surface and an extent of the protrusion; a handle attached to the outer surface via the aperture, the handle including: a body including a first end, a second end opposite the first end, and an insertable member disposed between the first end and the second end and extending into the aperture to secure the handle to the outer surface, the insertable member including a tab that retains the insertable member in the aperture when in an engaged state; and a locking mechanism moveable relative to the insertable member between a locked state and an unlocked state, the locking mechanism including a flexible extension, and when in the locked state, the locking mechanism maintains the tab in the engaged state and the flexible extension is positioned to maintain the locking mechanism in the locked state.

Aspect 15. The wafer carrier of aspect 14, wherein when in the locked state, the locking mechanism extends between the insertable member and the outer surface and a thickness of the locking mechanism maintains the tab in the engaged state.

Aspect 16. The wafer carrier of either one of aspect 14 and 15, wherein the insertable member extends into the aperture in a first direction, and the thickness of the locking mechanism extends in a second direction perpendicular to the first direction.

Aspect 17. The wafer carrier of any one of aspects 14-16, wherein when in the locked state, the locking mechanism extends between the insertable member and the outer surface.

Aspect 18. The wafer carrier of any one of aspects 14-17, wherein the insertable member is inserted into the aperture in a first direction, and the locking mechanism moves from the unlocked state to the locked state in a second direction parallel to the first direction.

Aspect 19. The wafer carrier of any one of aspects 14, 15, 17, and 18, further comprising: a rail extending along the outer surface, wherein the handle includes a projection extending from the first end of the body in a first direction and a second direction in that order, the first direction being away from the body and non-planar to the first end of the body, and the second direction being different from the first direction, and the projection engaging the rail to secure the handle to the outer surface.

Aspect 20. The wafer carrier of aspect 19, wherein the projection of the handle is moved to engage the rail in the same direction as the insertable member is inserted into the aperture.

Aspect 21. The wafer carrier of either one of aspects 19 and 20, further comprising: a first side, the outer surface defined by the first side, and the handle extends along the first side, and the engagement of the projection and the rail inhibiting movement of the handle away from or towards the first side.

Aspect 22. The wafer carrier of any one of aspects 19-21, further comprising: a slot defined by an inner surface of the rail, the projection extending into the slot.

Aspect 23. The wafer carrier of any one of claims 14-22, wherein the wafer carrier is one of a front opening unified pod and a front opening shipping box.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in the details, particularly in matters of shape, size, and arrangement of parts without exceeding the scope of the disclosure. The disclosure's scope is, of course, defined in the language in which the appended claims are expressed.

What is claimed is:

1. A handle for a wafer carrier, the wafer carrier including a protrusion extending from an outer surface of the wafer carrier, the protrusion defining an aperture between the outer surface of the wafer carrier and an extent of the protrusion for attaching the handle, the handle comprising:
   a body including:
      a first end and a second end opposite the first end, and an insertable member disposed between the first end and the second end of the body and configured to be inserted into the aperture to secure the handle to the wafer carrier, the insertable member including a tab that retains the insertable member in the aperture when in an engaged state;
   a locking mechanism moveable relative to the insertable member between a locked state and an unlocked state, the locking mechanism including a flexible extension, and in the locked state, the locking mechanism limits flexion of the insertable member and limits the movement of the tab and the flexible extension positioned in the aperture preventing an external force being placed on the locking mechanism in the locked state
   wherein the body includes a guide disposed in the body adjacent to the insertable member, the locking mechanism retained by the guide such that the locking mechanism is slidably attached to the body.

2. The handle of claim 1, wherein the handle is configured to be attached and non-destructively detached from the wafer carrier.

3. The handle of claim 1, wherein the tab is disposed on a first side of the insertable member, and when in the locked state, the locking mechanism extends along a second side of the insertable member opposite to the first side.

4. The handle of claim 1, wherein when in the locked state, a thickness of the locking mechanism maintains the tab in the engaged state.

5. The handle of claim 1, wherein when the locking mechanism is in the locked state, a geometry of the flexible extension maintains the locking mechanism in the locked state.

6. The handle of claim 1, wherein the flexible extension is configured to be flexible to allow movement of the locking mechanism from the locked state in response to an external force flexing the flexible extension.

7. The handle of claim 1, wherein the insertable member is disposed at an end of the handle, at the first end, or between a grip on the handle and the first end.

8. The handle of claim 1, further comprising:
   a projection extending from the first end of the body in a first direction and a second direction in that order, the first direction being away from the body and non-planar to the first end of the body, and the second direction different from the first direction, wherein the projection is configured engage a rail of the wafer carrier to secure the handle to the wafer carrier.

9. The handle of claim 1, wherein the insertable member is flexible relative to the rest of the body, and the tab movable into the engaged state by the flexing of the insertable member.

10. The handle of claim 1, wherein the locking mechanism extends through the body.

11. The handle of claim 1, wherein the locking mechanism extends through a through-hole of the body, and when in the locked state, the flexible extension causes a width of the locking mechanism to be larger than a corresponding width of the through-hole.

12. The handle of claim 1, wherein the body includes a grip disposed between the first end and the second end of the body.

13. A wafer carrier comprising:
   an outer surface;
   a protrusion extending from the outer surface, the protrusion defining an aperture between the outer surface and an extent of the protrusion;
   a handle attached to the outer surface via the aperture, the handle including:
      a body including a first end, a second end opposite the first end, and an insertable member disposed between the first end and the second end and extending into the aperture to secure the handle to the outer surface, the insertable member including a tab that retains the insertable member in the aperture when in an engaged state; and
   a locking mechanism moveable relative to the insertable member between a locked state and an unlocked state, the locking mechanism including a flexible extension, and when in the locked state, the locking mechanism limits flexion of the insertable member and limiting the movement of the tab and the flexible extension is positioned in the aperture preventing an external force being placed on the locking mechanism in the locked state
   wherein the body includes a guide disposed in the body adjacent to the insertable member, the locking mechanism retained by the guide such that the locking mechanism is slidably attached to the body.

14. The wafer carrier of claim 13, wherein when in the locked state, the locking mechanism extends between the insertable member and the outer surface and a thickness of the locking mechanism maintains the tab in the engaged state.

15. The wafer carrier of claim 13, wherein the insertable member is inserted into the aperture in a first direction, and the locking mechanism moves from the unlocked state to the locked state in a second direction parallel to the first direction.

16. The wafer carrier of claim 13, further comprising:
   a rail extending along the outer surface,
   wherein the handle includes a projection extending from the first end of the body in a first direction and a second direction in that order, the first direction being away from the body and non-planar to the first end of the body, and the second direction different from the first direction, and
   the projection engaging the rail to secure the handle to the outer surface.

* * * * *